United States Patent
Suthiwongsunthorn et al.

(10) Patent No.: US 7,863,721 B2
(45) Date of Patent: Jan. 4, 2011

(54) METHOD AND APPARATUS FOR WAFER LEVEL INTEGRATION USING TAPERED VIAS

(75) Inventors: Nathapong Suthiwongsunthorn, Singapore (SG); Pandi Chelvam Marimuthu, Singapore (SG)

(73) Assignee: STATS ChipPAC, Ltd. (SG)

( * ) Notice: Subject to any disclaimer, the term of this patent is extended or adjusted under 35 U.S.C. 154(b) by 393 days.

(21) Appl. No.: 12/137,242

(22) Filed: Jun. 11, 2008

(65) Prior Publication Data

US 2009/0309235 A1 Dec. 17, 2009

(51) Int. Cl.
*H01L 23/02* (2006.01)

(52) U.S. Cl. ............... 257/686; 257/777; 257/E25.006; 257/E25.013; 257/E25.018; 257/E25.021; 257/E25.027; 257/E23.085; 257/698; 438/108

(58) Field of Classification Search ................. 257/686, 257/777, E25.006, E25.013, E25.018, E25.021, 257/E25.027, E23.085, 698; 438/109
See application file for complete search history.

(56) References Cited

U.S. PATENT DOCUMENTS

| | | | |
|---|---|---|---|
| 6,555,917 B1 * | 4/2003 | Heo ........................... | 257/777 |
| 6,589,813 B1 * | 7/2003 | Park ........................... | 438/109 |
| 6,903,443 B2 * | 6/2005 | Farnworth et al. .......... | 257/621 |
| 7,115,972 B2 * | 10/2006 | Dotta et al. ................. | 257/621 |
| 7,118,989 B2 | 10/2006 | Ramanathan et al. | |
| 7,157,787 B2 | 1/2007 | Kim et al. | |
| 7,541,217 B1 * | 6/2009 | Shih et al. ................... | 438/109 |
| 7,602,070 B2 * | 10/2009 | Tong et al. .................. | 257/777 |
| 7,615,406 B2 * | 11/2009 | Higashi et al. .............. | 438/106 |
| 7,683,473 B2 * | 3/2010 | Kasai et al. ................. | 257/698 |
| 7,683,478 B2 * | 3/2010 | Chen et al. .................. | 257/723 |
| 7,755,151 B2 * | 7/2010 | Lim et al. .................... | 257/416 |

\* cited by examiner

*Primary Examiner*—Jasmine J Clark
(74) *Attorney, Agent, or Firm*—Robert D. Atkins

(57) ABSTRACT

A semiconductor device has first and second wafers having bond pads. The bond pad of the second wafer is connected to the bond pad of the first wafer using a conductive adhesive. A first interconnect structure is formed within the second wafer and includes a first via formed in a back surface of the second wafer to expose the bond pad of the second wafer. A first metal layer is formed conformally over the first via and is in electrical contact with the bond pad of the second wafer. A third wafer is mounted over the second wafer by connecting a bond pad formed over a front surface of the third wafer to the first metal layer. A second interconnect structure is formed over a backside of the third wafer opposite the front surface. The second interconnect structure is electrically connected to the first metal layer.

25 Claims, 27 Drawing Sheets

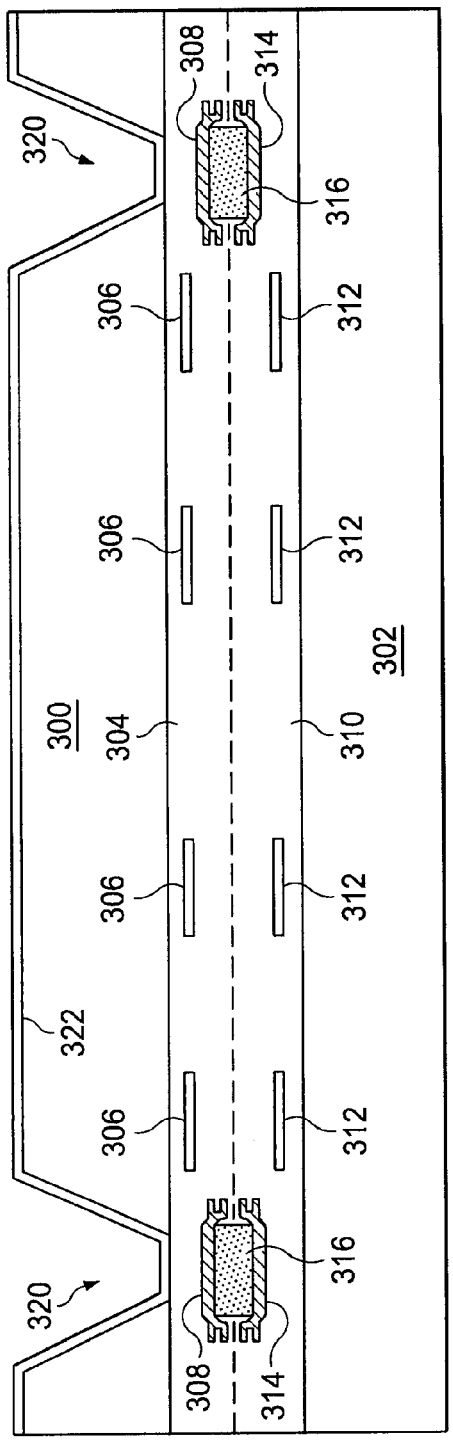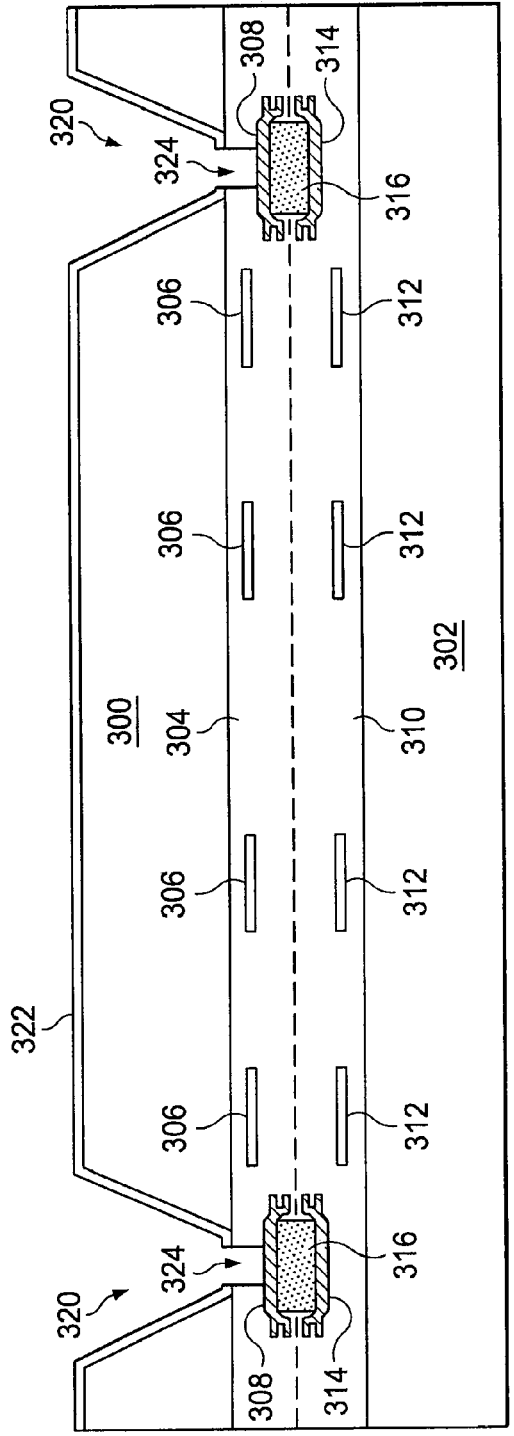

METHOD AND APPARATUS FOR WAFER LEVEL INTEGRATION USING TAPERED VIAS

FIELD OF THE INVENTION

The present invention relates in general to semiconductor devices and, more particularly, to a semiconductor device with three-dimensional wafer-level integration.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

Semiconductor devices operate by exploiting the electrical properties of semiconductor materials. Generally, semiconductor materials have electrical properties that vary between those of conductors and insulators. In most cases, semiconductors have poor electrical conductivity, however their conductivity can be modified through the use of doping and/or applied electrical fields. Doping involves introducing impurities into the semiconductor material to adjust its electrical properties. Depending on the amount of doping performed, semiconductor materials may be permanently modified to conduct electricity as well as other conductors or to act as insulators. The application of electric fields also modifies the conductivity of semiconductor materials by controlling the distribution of conductive particles within the material. Through doping and the application of electronic fields, electronic devices and integrated circuits are formed and operated over a semiconductor substrate. The devices and circuits include multiple layers of semiconductor, insulator and conductive materials.

Because the electrical properties of semiconductor materials may be altered by the application of electric fields, they can be used to manufacture both passive and active circuit elements. Passive devices include capacitors, inductors, resistors and other devices that are not capable of power gain. Active devices, however, include transistors and allow for the creation of circuits that can both amplify and switch electrical signals. Transistors are the fundamental elements of modern computing systems and allow for the formation of logic circuits that include complex functionality, and provide high performance.

Many transistors can be combined into a single integrated circuit formed over a semiconductor wafer or substrate. Integrated circuits combine many transistors and other passive and active devices over a single substrate to provide complex electronic circuits such as processors, microcontrollers, digital signal processors, and memory systems. Modern integrated circuits may include tens of millions of transistors and provide the complex functionality of all computing systems. Integrated circuits and other semiconductor devices in electronic systems provide high performance in a small area and may be created using cost-efficient manufacturing processes.

The manufacture of semiconductor devices and integrated circuits involves formation of a wafer having a plurality of die. Each semiconductor die contains transistors and other active and passive devices performing a variety of electrical functions. For a given wafer, each die from the wafer typically performs the same electrical function. Semiconductors devices are formed in two steps referred to as front-end and back-end manufacturing that involve formation of the die and packaging for an end user.

Front-end manufacturing generally refers to formation of the semiconductor devices on the wafer. During formation of the devices, layers of a dielectric material such as silicon dioxide are deposited over the wafer. The dielectric facilitates the formation of transistors and memory devices. Metal layers are deposited over the wafer and patterned to interconnect the various semiconductor devices. The finished wafer has an active side containing the transistors and other active and passive components. After the devices are formed, they are tested in a preliminary testing step to verify the devices are operational. If a sufficiently high number of devices are discovered to contain defects, the devices or even the entire wafer may be discarded.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device. After singulation, the individual die are mounted to a package substrate that includes pins or contact pads for interconnection with other system components. Contact pads formed over the semiconductor die are then connected to contact pads within the package. Often, wirebonding is used to make the connection, however other connection technologies such as solder bumps or stud bumping may be used. After wirebonding, an encapsulant or other molding material is deposited over the package to provide physical support and electrical insulation. The finished package is then inserted into an electrical system and the functionality of the semiconductor device is made available to the other system components.

One goal of semiconductor manufacturing is to produce a package suitable for faster, reliable, smaller, and higher-density integrated circuits at lower cost. Flip chip packages or wafer level packages (WLPs) are ideally suited for integrated circuits demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation distance, lower capacitance, and achieve overall better circuit performance.

In many applications, it is preferable to manufacture a package having a small footprint and a high density input/output connection pad count. A small package footprint may be achieved by bonding a plurality of wafers together and singulating the semiconductor die formed thereon. However, when bonding two or more wafers together that contain semiconductor die providing differing functionality and/or different contact pad locations, it can be difficult to form the appropriate electrical connections between the wafers.

SUMMARY OF THE INVENTION

In one embodiment, the present invention is a method of making a semiconductor device comprising providing a first wafer having a bond pad formed over a front surface of the first wafer, providing a second wafer having a bond pad formed over a front surface of the second wafer, and connecting the bond pads of the first and second wafers using a conductive adhesive. The method includes forming a first interconnect structure within the second wafer by forming a first via in a back surface of the second wafer opposite the front surface. The first via exposes the bond pad of the second wafer. Forming the first interconnect structure includes forming a first metal layer conformally over the first via. The first metal layer is in electrical contact with the bond pad of the second wafer. The method includes mounting a third wafer over the second wafer by connecting a bond pad formed over a front surface of the third wafer to the first metal layer, and forming a second interconnect structure over a backside of the third wafer opposite the front surface. The second interconnect structure is electrically connected to the first metal layer.

In another embodiment, the present invention is a method of making a semiconductor device comprising providing a first wafer having a bond pad formed over a front surface of the first wafer, providing a second wafer having a bond pad formed over a front surface of the second wafer, connecting the bond pads of the first and second wafers using a conductive adhesive, and forming a first interconnect structure within the second wafer. The method includes mounting a third wafer over the second wafer by connecting a bond pad formed over a front surface of the third wafer to the first interconnect structure, and forming a second interconnect structure over a backside of the third wafer opposite the front surface. The second interconnect structure is electrically connected to the first interconnect structure.

In another embodiment, the present invention is a method of making a semiconductor device comprising providing a first wafer having a bond pad formed over a front surface of the first wafer, providing a second wafer having a bond pad formed over a front surface of the second wafer, and connecting the bond pads of the first and second wafers using a conductive adhesive. The method includes forming a first interconnect structure within the second wafer by forming a first via in a back surface of the second wafer opposite the front surface. The first via exposes the bond pad of the second wafer. Forming the first interconnect includes forming a first metal layer conformally over the first via. The first metal layer is in electrical contact with the bond pad of the second wafer.

In another embodiment, the present invention is a semiconductor device comprising a first wafer having a bond pad formed over a front surface of the first wafer, and a second wafer having a bond pad formed over a front surface of the second wafer. The bond pad of the second wafer is connected to the bond pad of the first wafer using a conductive adhesive. The device includes a first interconnect structure formed within the second wafer. The first interconnect structure includes a first via formed in a back surface of the second wafer opposite the front surface. The first via exposes the bond pad of the second wafer. The first interconnect structure includes a first metal layer formed conformally over the first via. The first metal layer is in electrical contact with the bond pad of the second wafer. The device includes a third wafer mounted over the second wafer by connecting a bond pad formed over a front surface of the third wafer to the first metal layer, and a second interconnect structure formed over a backside of the third wafer opposite the front surface. The second interconnect structure is electrically connected to the first metal layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
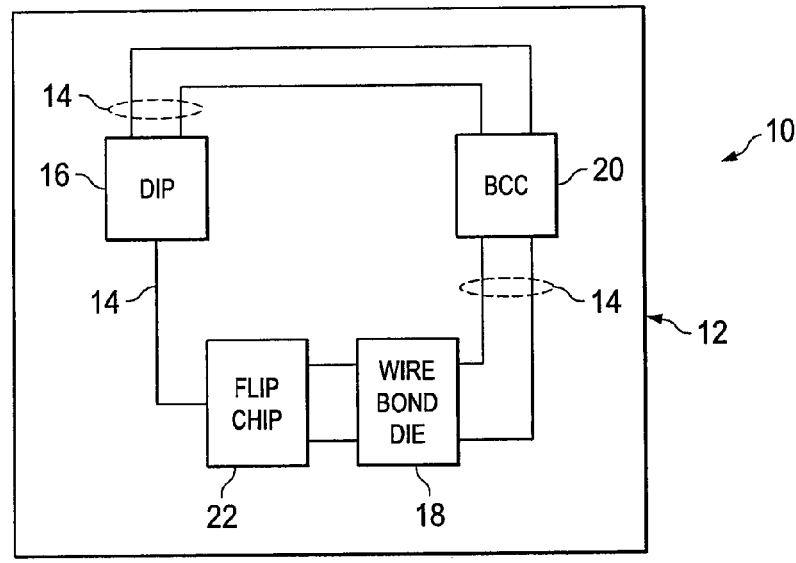
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
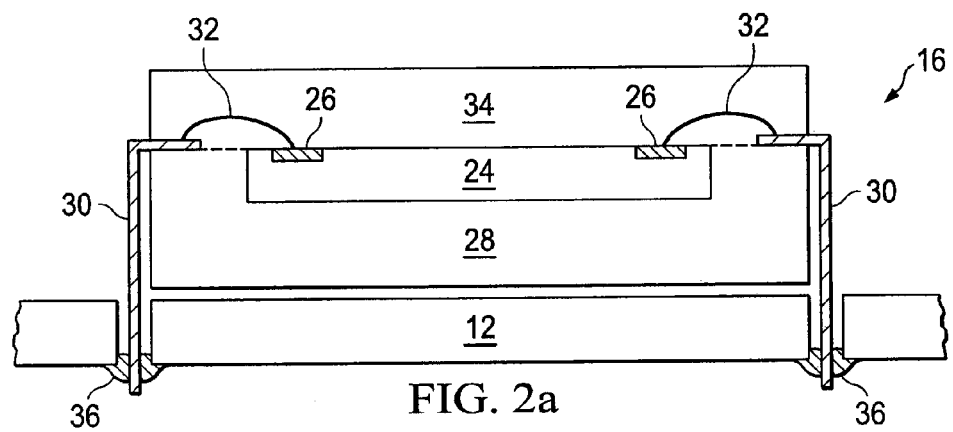
FIGS. 2A-2D illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
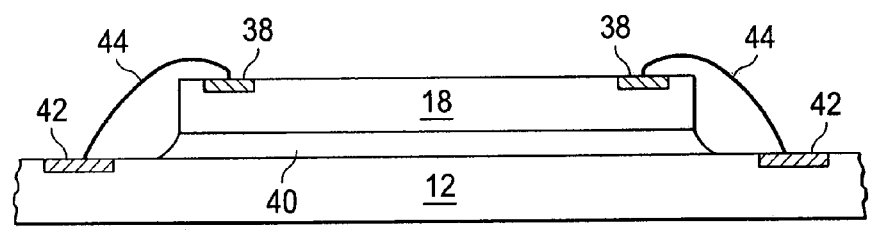

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
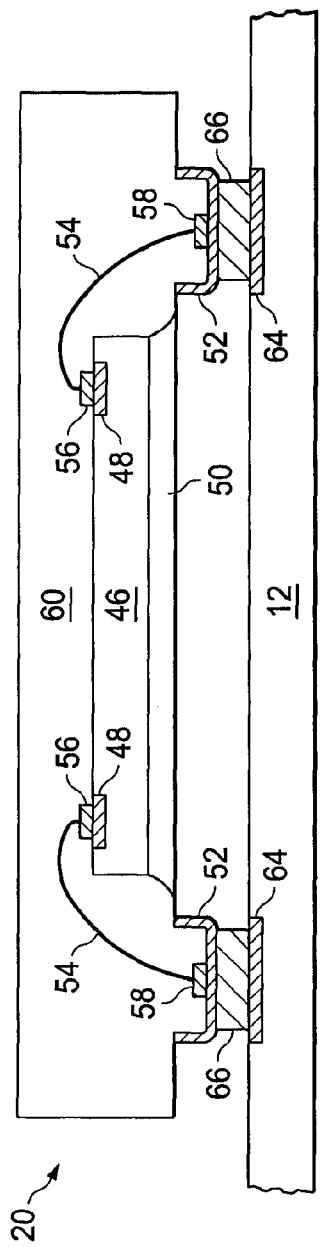

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
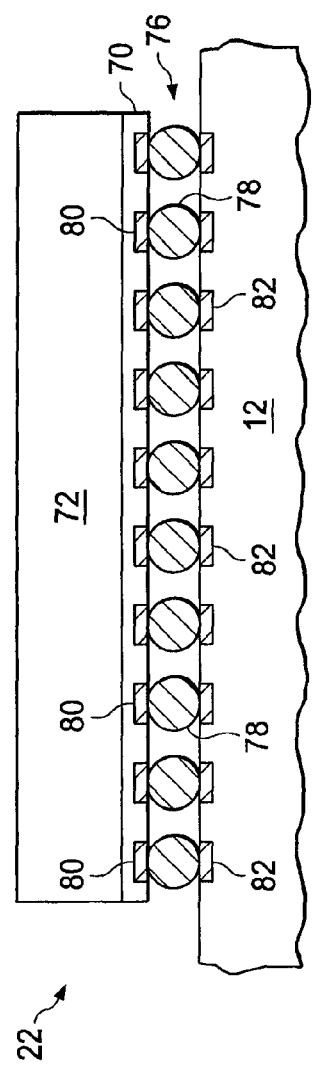

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
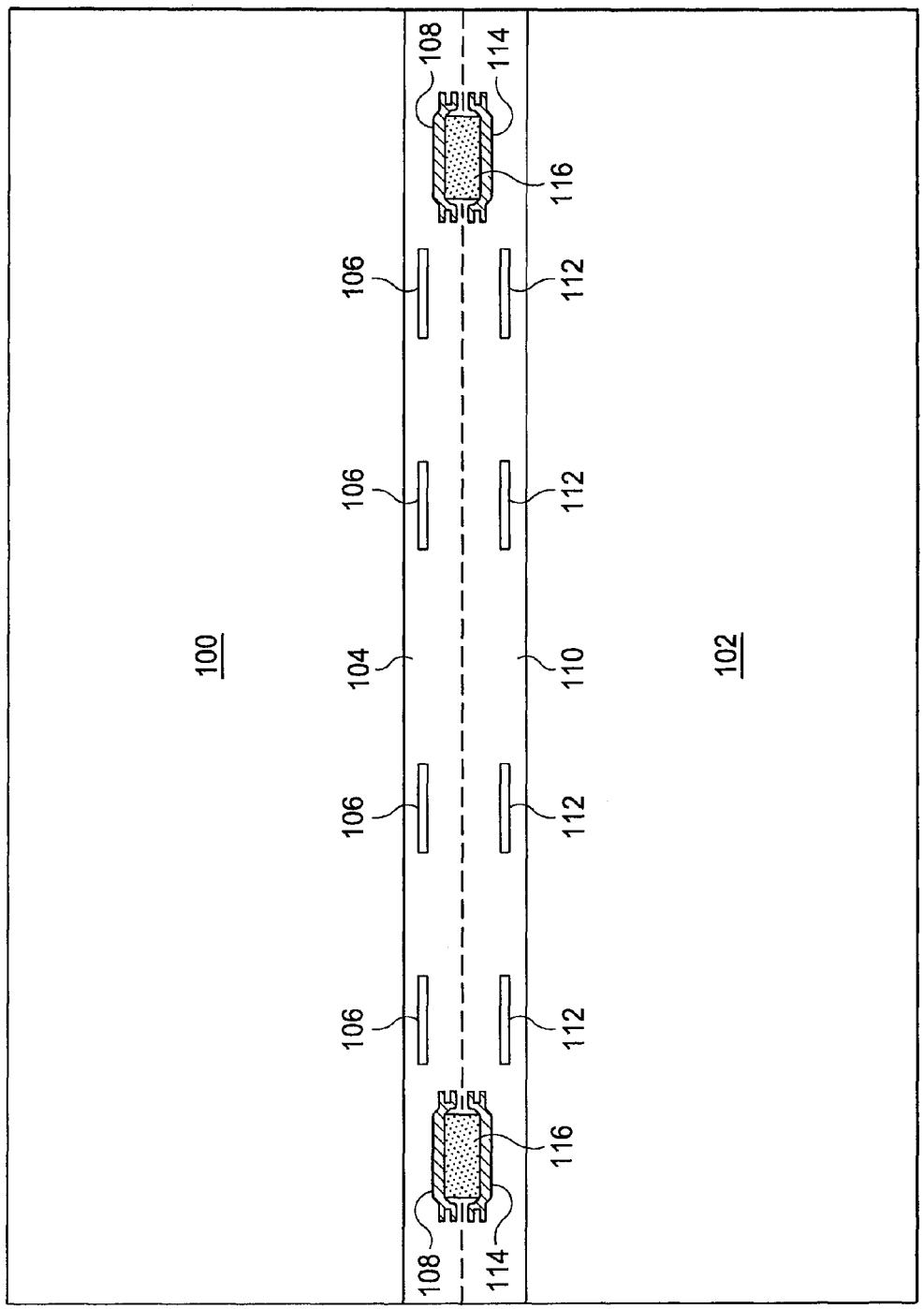
FIGS. 3A-3G illustrate a process of forming a wafer-level package integrating two wafers and forming a plurality of metallized through-silicon vias (TSVs) to interconnect the wafers.

FIGS. 3A-3G illustrate a process of 3D wafer-level integration to form a semiconductor package. Turning to FIG. 3A, wafer 100 is inverted and the front surface (including the active region of wafer 100) is bonded over the front surface of wafer 102. Wafers 100 and 102 can include silicon (Si), gallium arsenide (GaAs) or other substrate materials over which thin-film devices or other circuitry are formed. Devices formed over wafers 100 and 102 include active and passive devices such as resistors, capacitors, transistors, and inductors. The devices are made up of patterned conductive, resistive, and dielectric layers and are formed using wafer-level fabrication processes as described above. Depending upon the application, wafers 100 and 102 may include similar or differing configurations of semiconductor die, components and contact or bond pads. In one embodiment, wafer 100 includes a plurality of semiconductor die providing memory functionality while wafer 102 includes a plurality of semiconductor die providing baseband functionality. Inter-level dielectric 104 is formed over a surface of wafer 100. Dielectric 104 acts as an insulator and provides physical protection to the devices formed over wafer 100. Dielectric 104 includes an oxide, nitride, or polymer dielectric material. Within dielectric 104, metal layer 106 is formed using an implantation or deposition process. Metal layer 106 includes one or more layers of conductive material and electrically interconnects one or more of the devices formed within wafer 100 and bond pads 108. Contact or bond pads 108 are formed over a surface of wafer 100. Bond pads 108 include a conductive material and are formed using a PVD, CVD, electrolytic plating, or electroless plating process. Inter-layer dielectric 110 and metal layer 112 are formed over a surface of wafer 102. Metal layer 112 may include multiple layers of conductive material. Bond pads 114 include a conductive material and are formed over a surface of wafer 102 using a PVD, CVD, electrolytic plating, or electroless plating process. Bond pads 108 and 114 are bonded together using conductive adhesive or metal bonding 116. Additional adhesive material such as a thermal epoxy may be deposited between wafers 100 and 102 to enhance the physical bond between the structures.

Figure 3B:
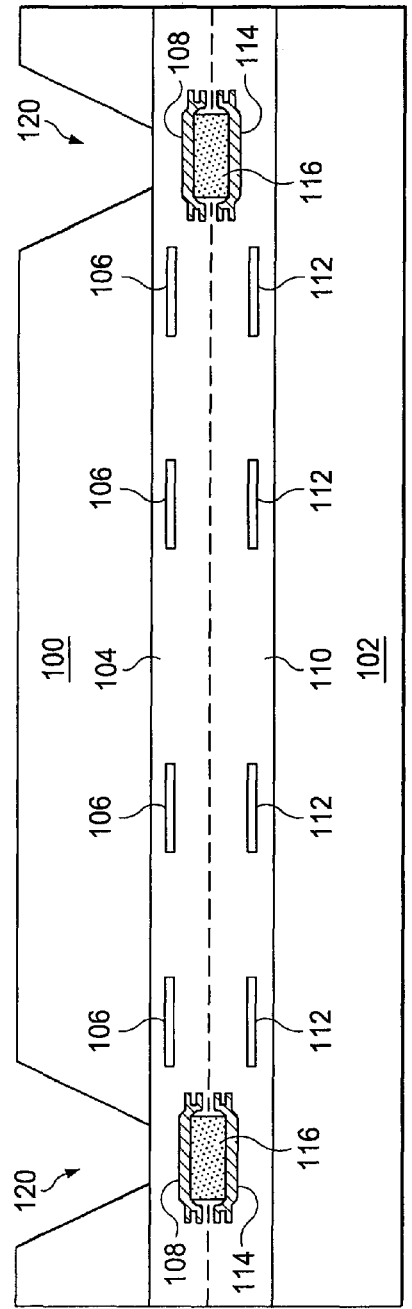

Turning to FIG. 3B, both wafers 100 and 102 are thinned to a required thickness depending upon the application. In one embodiment, the thickness ranges from 30 μm to 300 μm. Wafers 100 and 102 may be thinned using a chemical-mechanical planarization (CMP), mechanical backgrinding, plasma etching, wet etch, dry etch or another thinning process. Through-silicon vias (TSVs) 120 are formed in wafer 100 using an etching or drilling process such as laser drilling. TSVs 120 expose a portion of dielectric 104. In the present embodiment, TSVs 120 have a tapered geometry, however TSVs having alternative geometries may be formed in wafers 100 or 102.

Figure 3C:
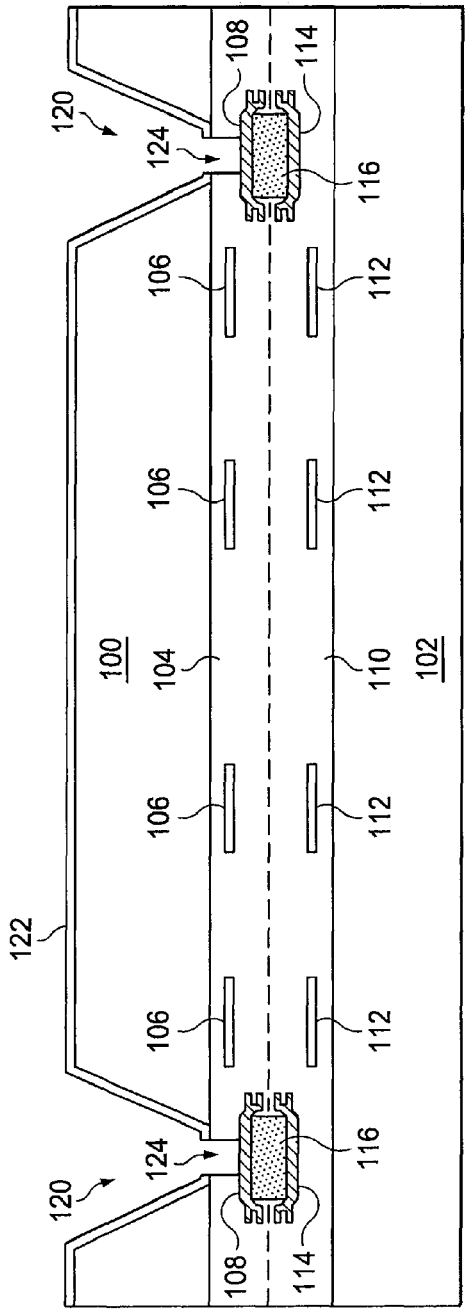

Turning to FIG. 3C, dielectric 122 is conformally deposited over wafer 100. Dielectric 122 acts as an insulator and includes one or more layers of an oxide, nitride, or polymer dielectric material. Other suitable dielectric materials include silicon nitride (SiN), tantalum oxide (Ta2O5), hafnium oxide (HfO2), or a dielectric film material. TSVs 120 are further etched to form vias 124. Vias 124 are formed by etching or laser drilling dielectric 122 and dielectric 104 to expose a portion of bond pads 108.

Figure 3D:
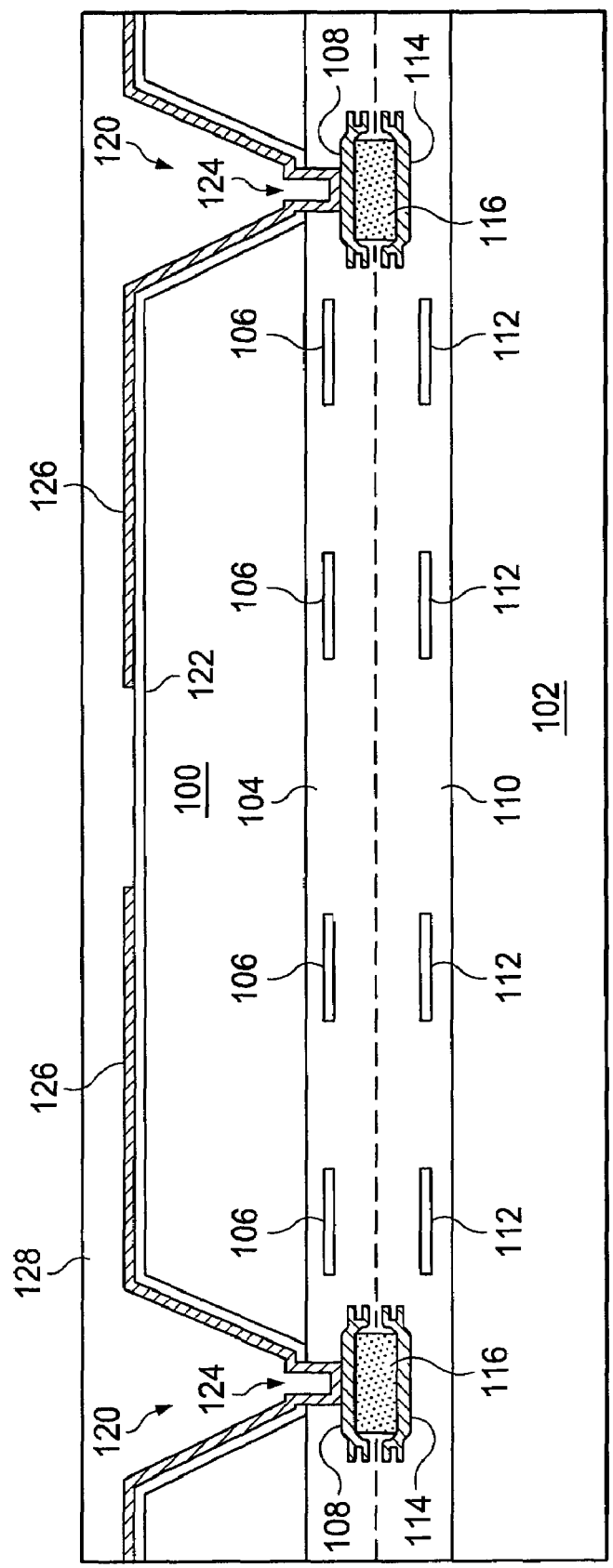
Figure 3E:
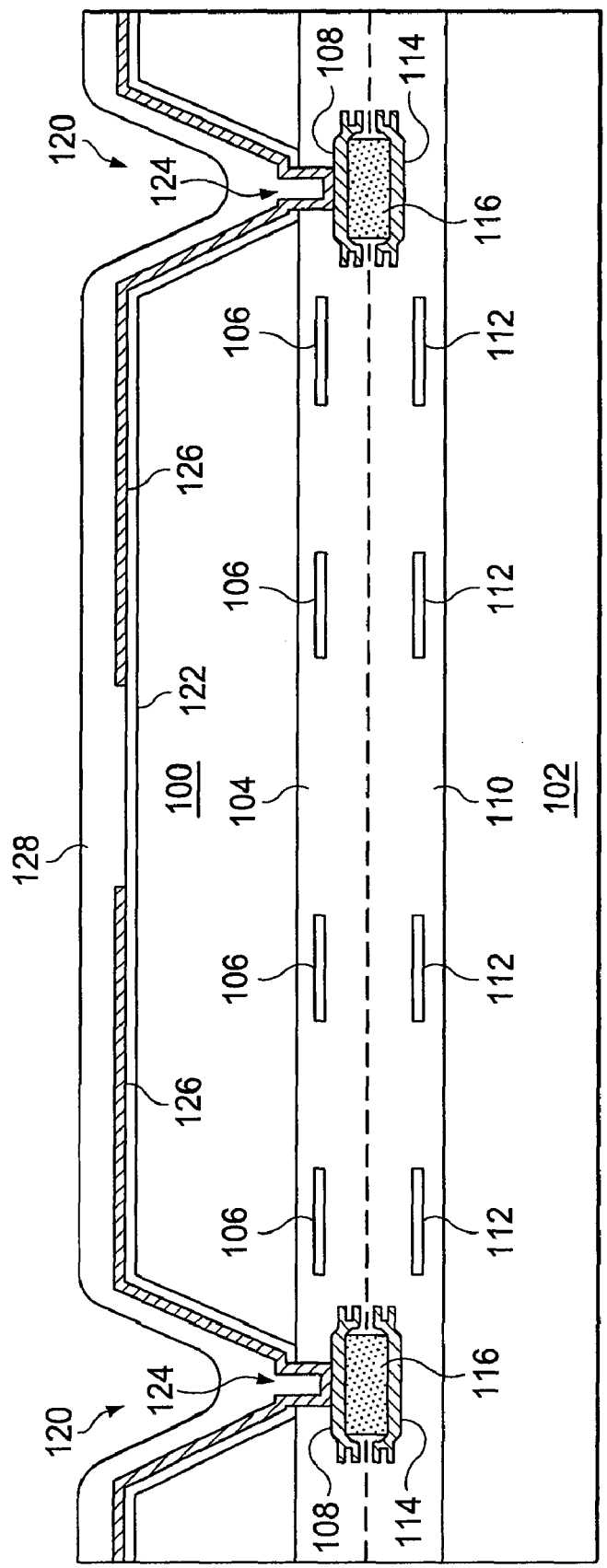

With reference to FIG. 3D, conductive or metal layer 126 is patterned and deposited over dielectric 122 and vias 124 in contact with bond pads 108. Metal layer 126 may be deposited as a conformal layer and comprises a portion of a redistribution layer (RDL). The RDL operates as a conductive layer to route electrical signals to various areas of the package, including active and passive circuits of the various semiconductor die, and provides various electrical interconnect options during package integration. Metal layer 126 may include multiple layers of conductive material such as titanium (Ti), titanium nitride (TiN), Cu, titanium-tungsten alloy (TiW), nickel-vanadium NiV, Al, Au, Ni, or other electrically conductive material suitable for deposition on a substrate. Passivation 128 is formed over wafer 100 to provide electrical insulation and physical protection to the device and the metal layers formed over the device. Passivation 128 includes an insulation material such as polyimide, benzocyclobutene (BCB), polybenzoxazoles (PBO), epoxy based insulating polymer, or other insulating polymer materials. With reference to FIG. 3D, passivation 128 is formed to fill TSVS 120. However, in other applications, passivation 128 is formed to only partially fill vias 120, for example by providing a coating formed over a top surface of wafer 100 (see FIG. 3E).

Figure 3F:
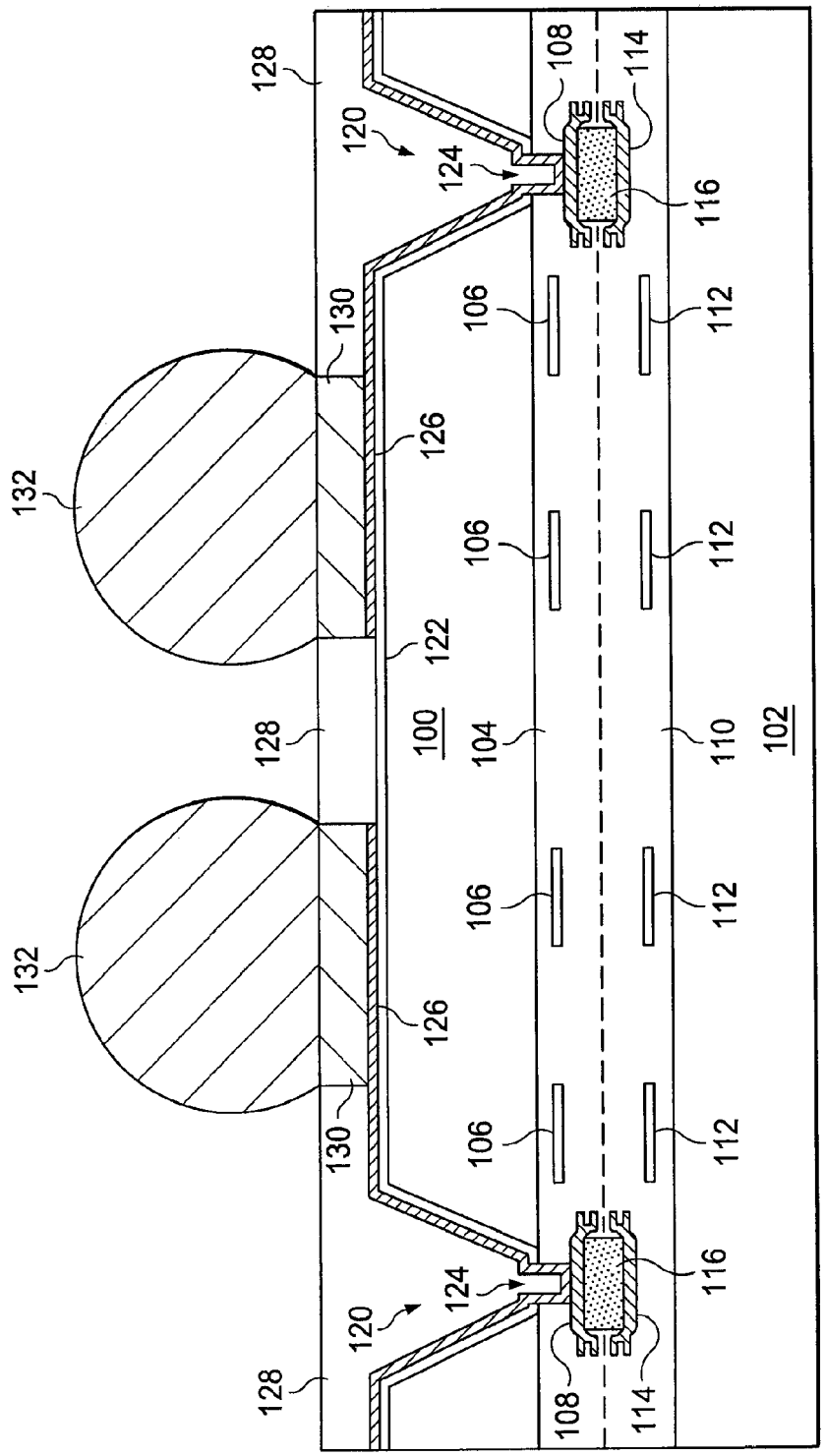

Turning to FIG. 3F, an optional electrical interconnect structure is formed over wafer 100. Passivation 128 is patterned or etched using a laser drilling, or etching process to expose a portion of metal layer 126. An optional under-bump metallization (UBM) 130 is formed over the exposed portions of metal layer 126. UBM 130 includes a conductive material and is formed in electrical contact with metal layer 126. In one embodiment, UBM 130 includes a wetting layer, barrier layer, and adhesive layer. Bumps 132 are formed and connected to UBM 130 and placed in electrical contact with the semiconductor devices of wafers 100 and 102. Bumps 132 are formed by a reflow process applied to solder material deposited over UBM 130. Bumps 132 include Au, or Cu structures or another conductive material such as tin/lead (Sn/Pb), copper/zinc (Cu/Zn), or copper/silver (Cu/Ag) solder each containing an optional flux material. The solder material is deposited using a ball drop or stencil printing process. Alternative interconnection structures include stud bumps, or stud pillars having square, round, rectangular or other shapes. Alternatively, the metal pad or UBM may be used as a wirebonding pad for interconnection.

Figure 3G:
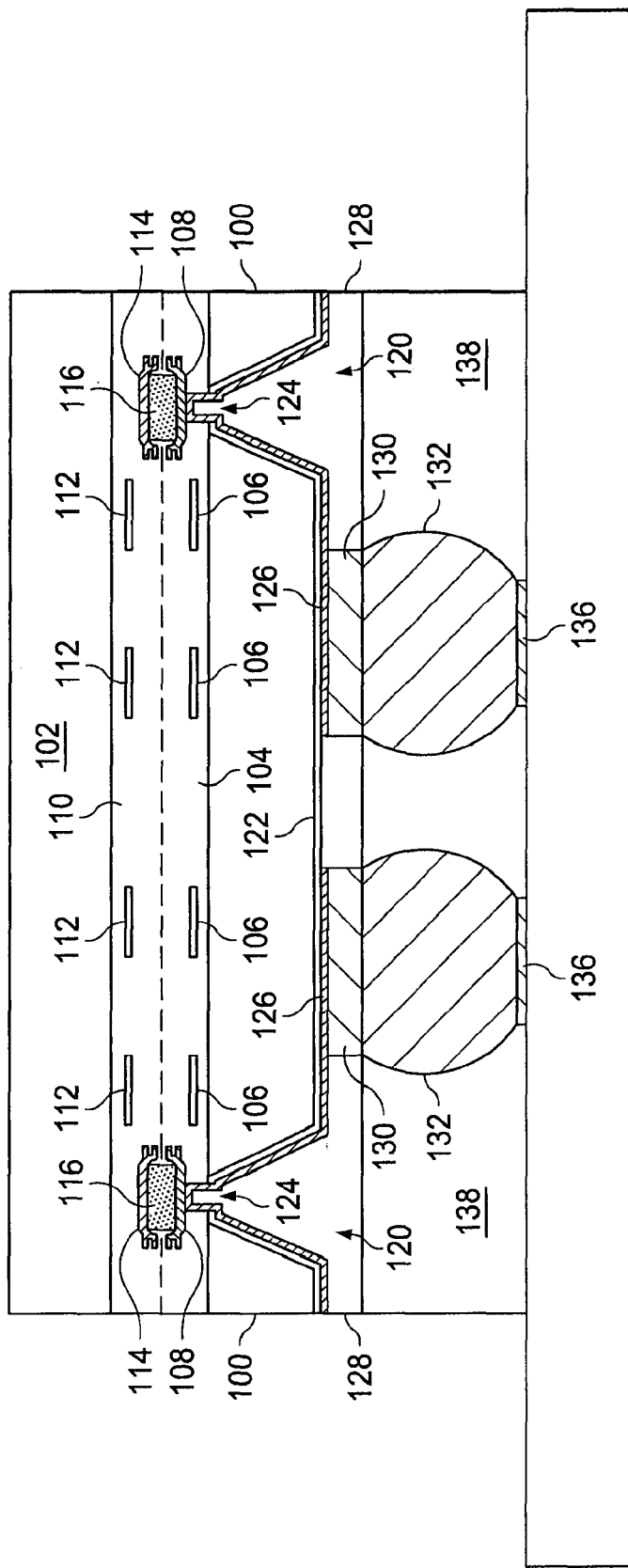

Turning to FIG. 3G, wafers 100 and 102 are singulated and the package is flip-chip mounted to substrate 134. Substrate 134 includes a PCB or other substrate for supporting and mounting electronic components. Bond pads 136 include a conductive material and are formed over substrate 134 using an electrolytic plating or electroless plating process. Bumps 132 are reflowed to connect bond pads 136 to UBM 130. An optional underfill 138 is deposited between wafer 100 and substrate 134. Underfill 138 includes a mold compound or other insulative material and provides physical support and electrical insulation to the package. Underfill 138 may further include a filler material to assist in matching the coefficient of thermal expansion (CTE) of the package to underfill 138. Similarly, a mold compound may be deposited over the package to provide protective encapsulation. In alternative embodiments, the package may be connected to substrate 134 using other surface mount technologies such as stud bumping, or wirebonding.

Figure 4A:
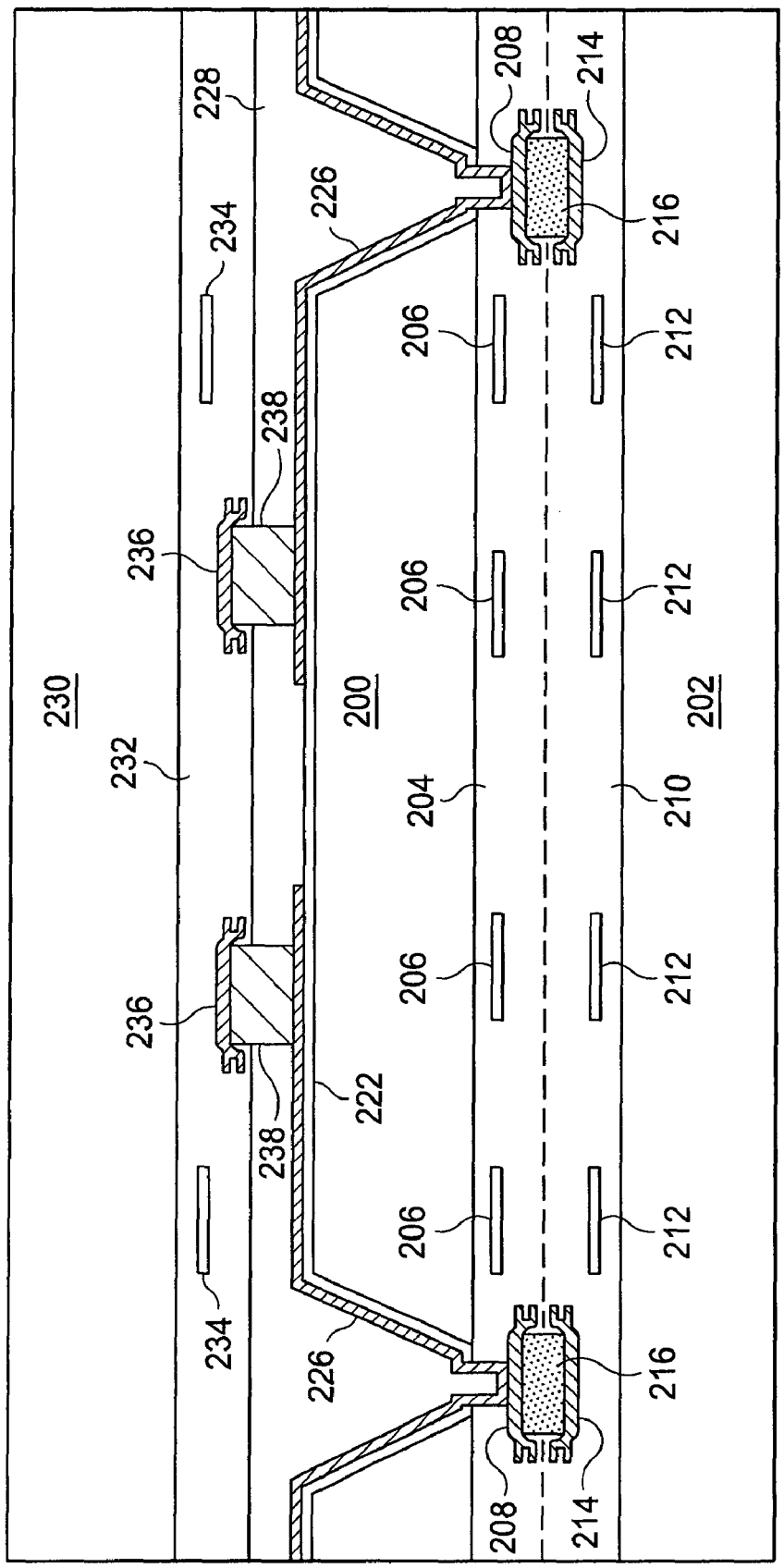
FIGS. 4A-4F illustrate a process of depositing a third wafer over a package that includes two bonded wafers and interconnecting the wafers using a plurality of metallized TSVs.

FIGS. 4A-4F illustrate a process of depositing a third wafer over a package that includes two bonded wafers and interconnecting the wafers using a plurality of metallized TSVs. With reference to FIG. 4A, wafer 200 is inverted and mounted over wafer 202 so that front surfaces of wafers 200 and 202 are bonded together. Wafers 200 and 202 can include Si, GaAs or other substrate materials over which thin-film devices or other circuitry are formed. Depending upon the application, wafers 200 and 202 may include different configurations of semiconductor die, components and contact or bond pads formed over a surface of each wafer. Inter-level dielectric 204 is formed over a surface of wafer 200. Dielectric 204 includes an oxide, nitride, or polymer dielectric material. Metal layer 206 is formed within dielectric 204 using an implantation or deposition process. Metal layer 206 electrically interconnects one or more of the devices formed within wafer 200. Bond pads 208 are formed over a surface of wafer 200. Bond pads 208 are electrically connected to one or more devices formed over wafer 200 and may be connected to metal layer 206. Inter-layer dielectric 210 and metal layer 212 are formed over a surface of wafer 202. Bond pads 214 include a conductive material and are formed over a surface of wafer 202 using a PVD, CVD, electrolytic plating, or electroless plating process. Bond pads 208 and 214 are bonded together using conductive adhesive or metal bonding 216. Additional adhesive material such as a thermal epoxy may be deposited between wafers 200 and 202 to enhance the physical bond between the structures. Both wafers 200 and 202 are thinned to a required thickness depending upon the application. TSVs are formed in wafer 200 by etching or laser drilling to expose a portion of dielectric 204.

Dielectric 222 is deposited conformally over wafer 200. The TSVs are further etched to form vias to expose a portion of bond pads 208. Conductive or metal layer 226 is patterned and deposited over dielectric 222 in contact with bond pads 208. Passivation 228 is deposited over wafer 200 to provide electrical insulation and physical support to the device. Passivation 228 includes an insulation material such as polyimide, BCB, PBO, epoxy based insulating polymer, or other insulating polymer materials. Passivation 228 is patterned or etched using a laser drilling, or etching process to expose a portion of metal layer 226.

Wafer 230 is deposited over the device with a front surface of wafer 230 being bonded to a back surface of wafer 200. Wafer 230 includes dielectric 232 that is deposited over the front surface of wafer 230. Within dielectric 232, metal layer 234 is formed using an implantation or deposition process. Metal layer 234 electrically interconnects one or more of the devices formed within wafer 230. Bond pads 236 are formed over a surface of wafer 230. Bond pads 236 are electrically connected to one or more devices formed over wafer 230 and may be connected to metal layer 234.

A front surface of wafer 230 is bonded to the backside of wafer 200 using metal layer 238. Metal layer 238 is deposited between bond pads 236 of wafer 230 and metal layer 226 of wafer 200 and forms an electrical and mechanical bond between wafers 230 and 200. Metal layer 238 includes a conductive material such as solder, conductive adhesive, or another conductive material suitable for bonding and electrically connecting bond pads 236 of wafer 230 and metal layer 226 of wafer 200. Metal layer 238 may be formed using a PVD, CVD, electrolytic plating, or electroless plating process. An adhesive material such as a thermal epoxy may be deposited between wafers 230 and 200 to enhance the physical bond between the wafers. Depending upon the application, wafer 230 may be thinned using a CMP or etching process to an appropriate thickness.

Figure 4B:
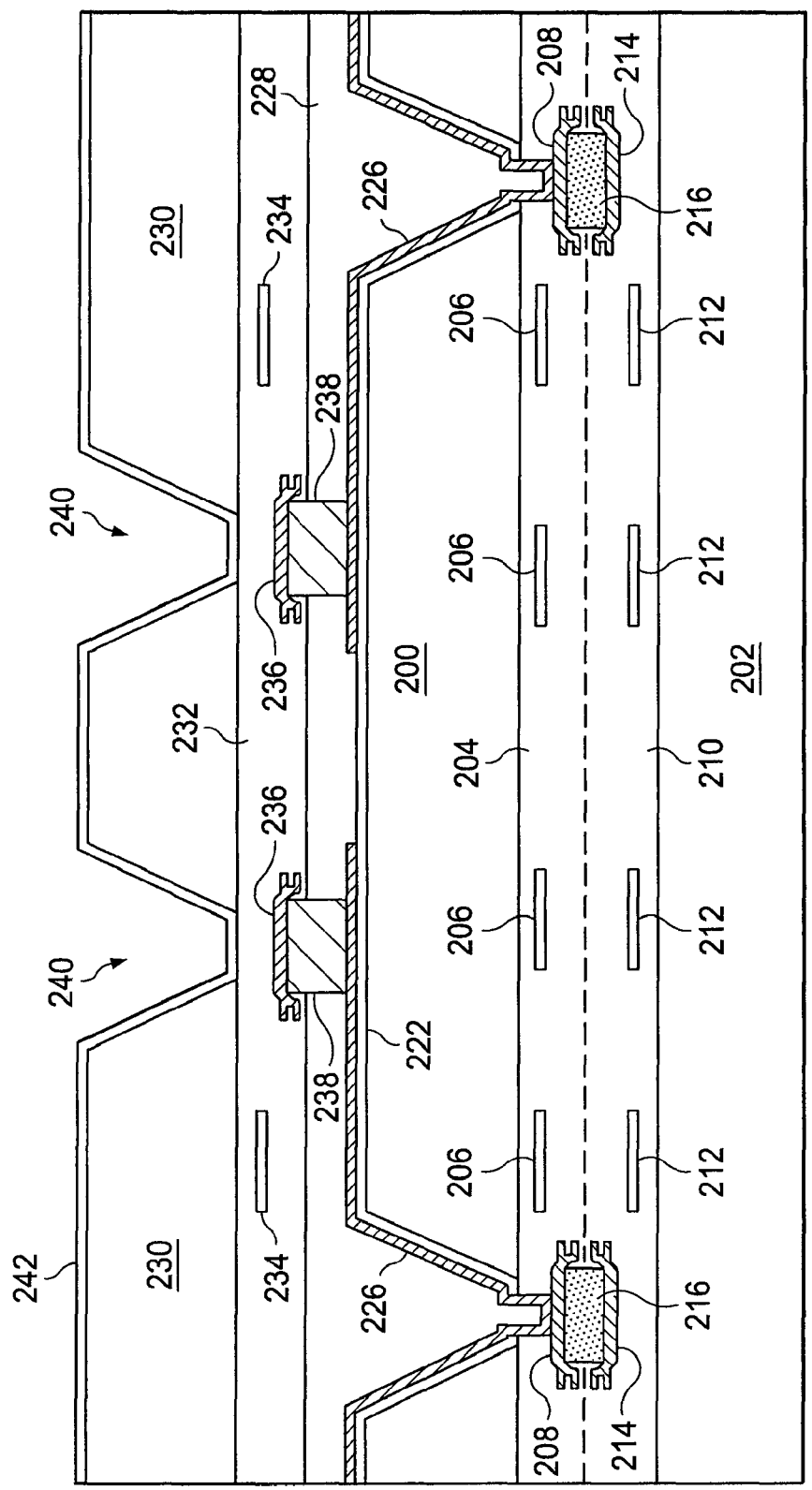

Turning to FIG. 4B, TSVs 240 are formed in the backside of wafer 230 by etching or laser drilling. TSVs 240 expose a portion of dielectric 232. In the present embodiment, TSVs 240 have a tapered geometry, however TSVs having alternative geometries may be formed in wafer 230. Dielectric 242 is conformally deposited over wafer 230. Dielectric 242 acts as an insulator and includes one or more layers of an oxide, nitride, or polymer dielectric material. Other suitable dielectric materials include SiN, Ta2O5, HfO2, or a dielectric film material.

Figure 4C:
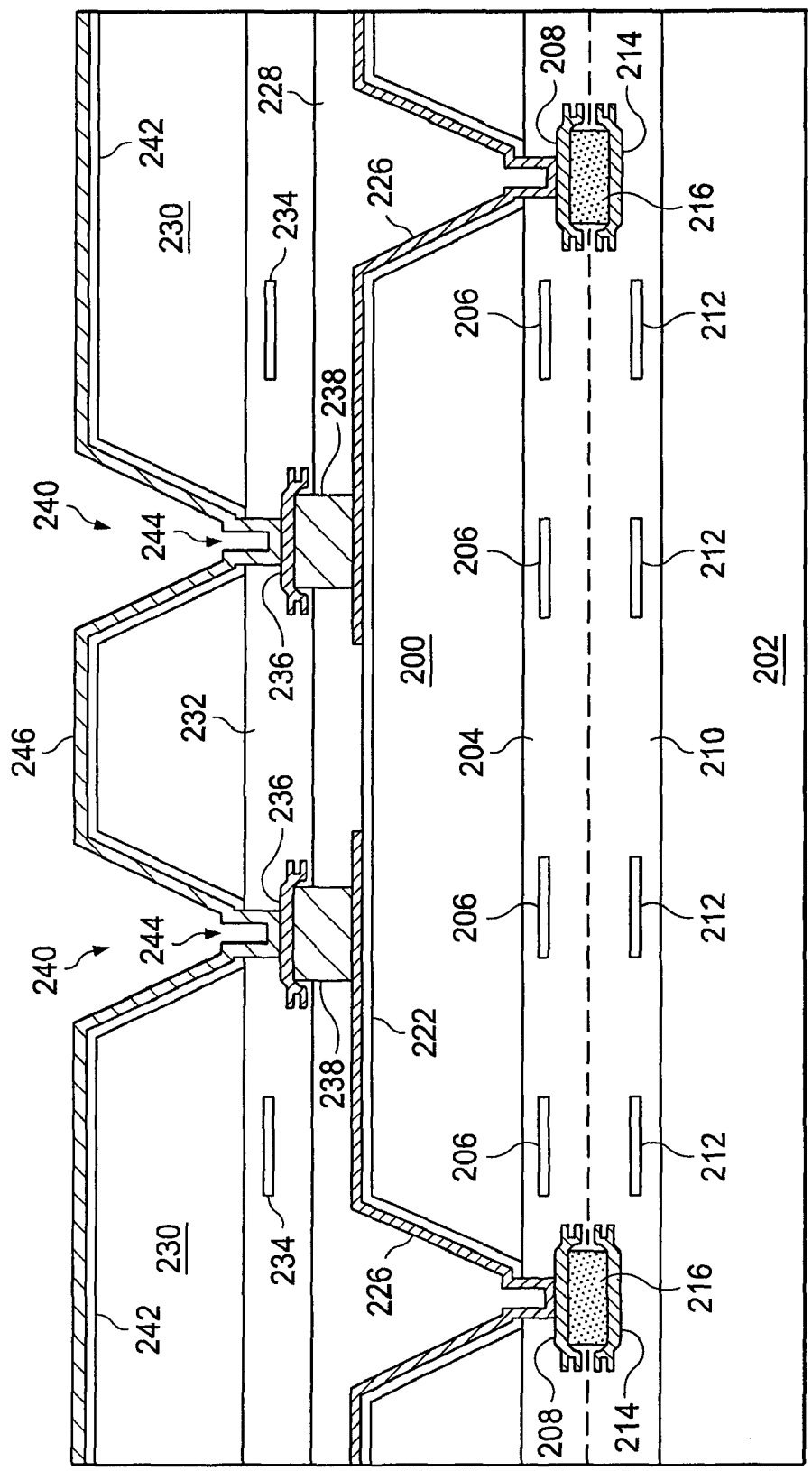

Turning to FIG. 4C, TSVs 240 are further etched to form vias 244. Vias 244 are formed by etching or laser drilling dielectric 242 and dielectric 232 to expose a portion of bond pads 236. Conductive or metal layer 246 is patterned and deposited over dielectric 242 and vias 244 in contact with bond pads 236. Metal layer 246 may be deposited conformally and comprises a portion of an RDL. The RDL operates as a conductive layer to route electrical signals to various areas of the package, including active and passive circuits of the various semiconductor die, and provides various electrical interconnect options during package integration. Metal layer 246 may include multiple layers of conductive material suitable for deposition on a substrate.

Figure 4D:
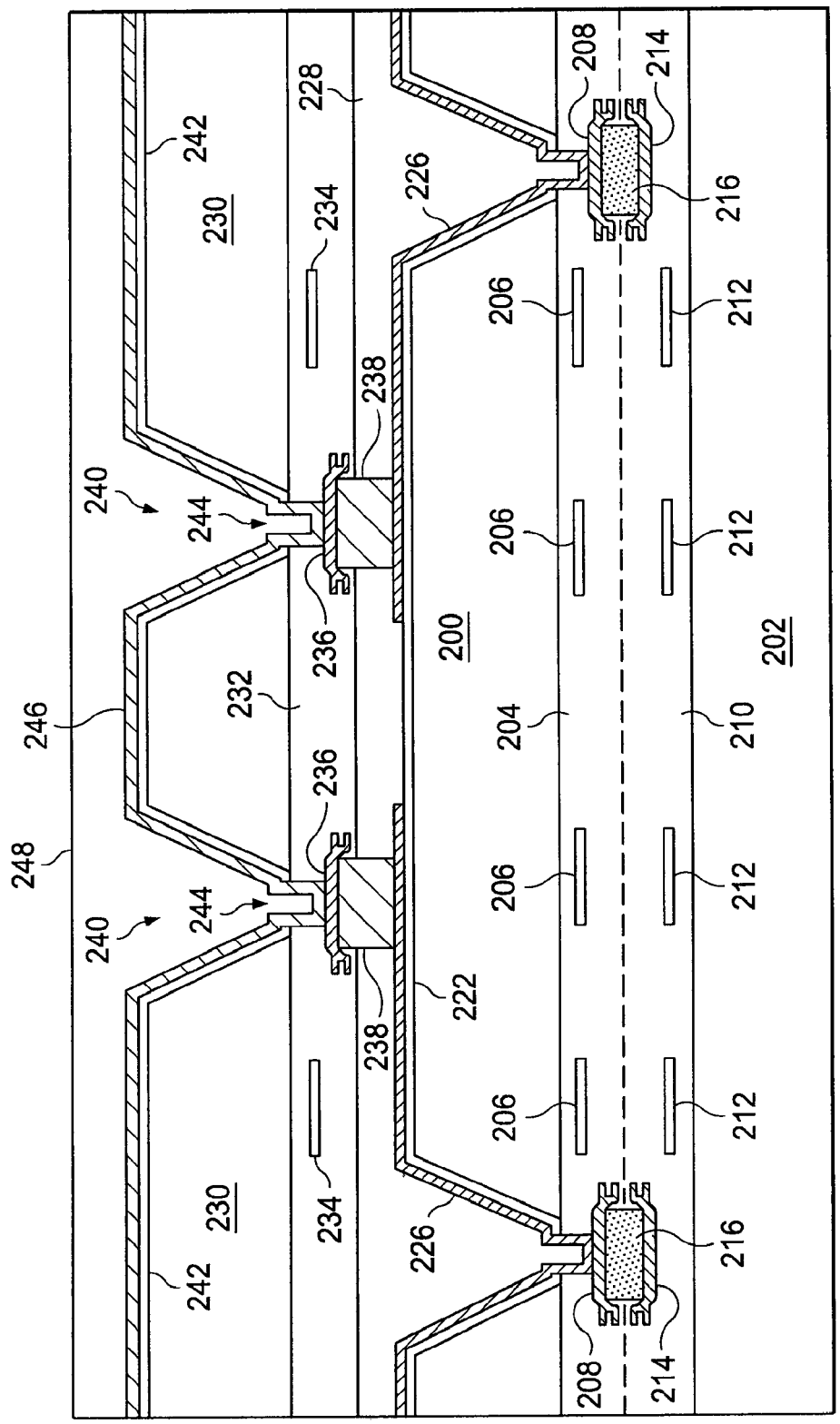

Turning to FIG. 4D, passivation 248 is deposited over wafer 230 to provide electrical insulation and physical support to the device. Passivation 248 includes an insulation material such as polyimide, BCB, PBO, epoxy based insulating polymer, or other insulating polymer materials. With reference to FIG. 4D, passivation 248 is deposited to fill TSVs 240. However, in other applications, passivation 248 is deposited to only partially fill vias 240, for example by coating a top surface of wafer 230.

Figure 4E:
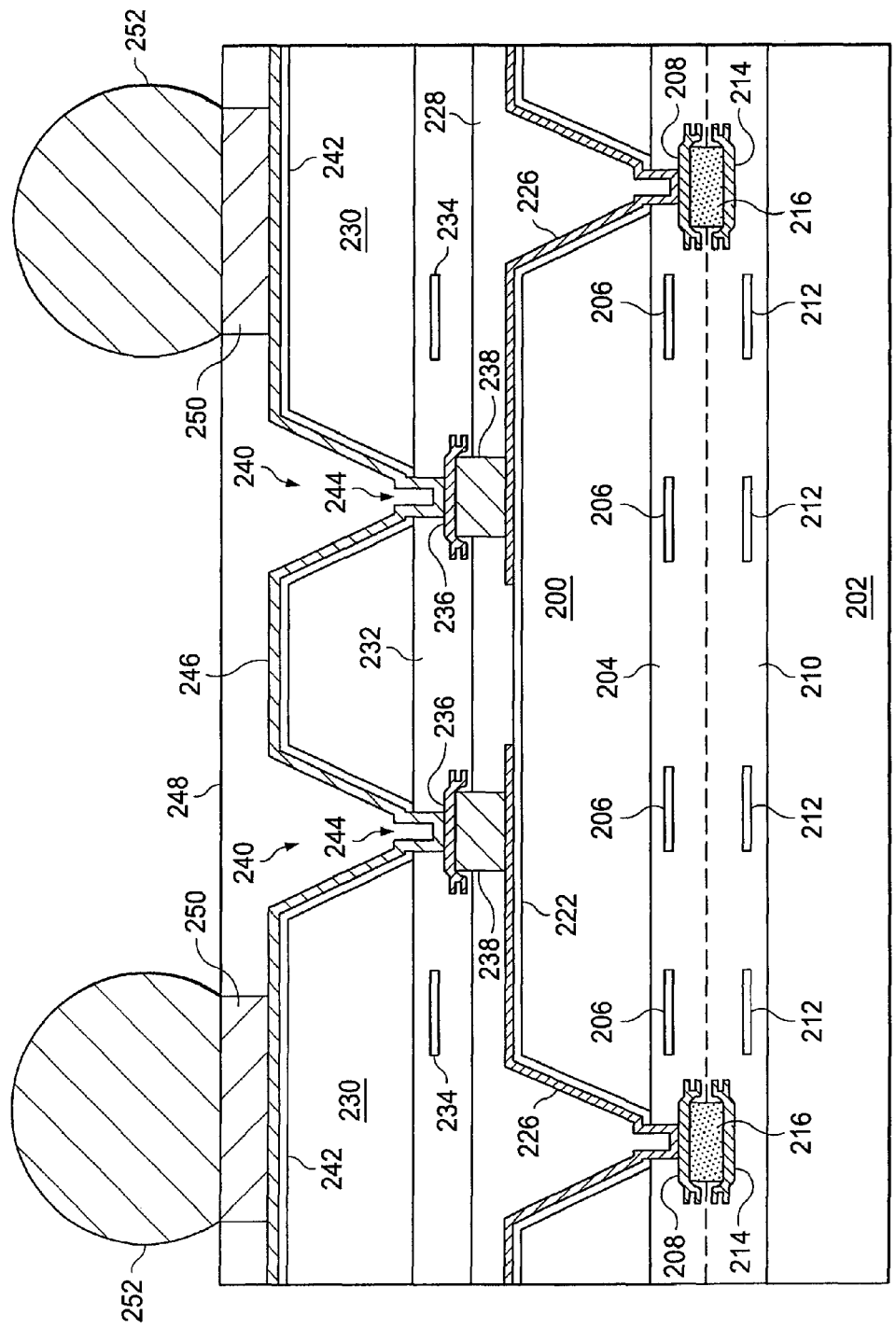

With reference to FIG. 4E, an optional interconnect structure is formed over wafer 230. Passivation 248 is patterned or etched using a laser drilling, or etching process to expose a portion of metal layer 246. An optional UBM 250 is formed over the exposed portions of metal layer 246. Bumps 252 are formed and connected to UBM 250 by a reflow process applied to solder material deposited over UBM 250. Bumps 252 include Au, or Cu structures or another conductive material such as Sn/Pb, CuZn, or CuAg solder each containing an optional flux material. Alternative interconnection structures include stud bumps, or stud pillars having square, round, rectangular or other shapes. Alternatively, the metal pad or UBM may be used as a wire-bonding pad for wire bond interconnection.

Figure 4F:
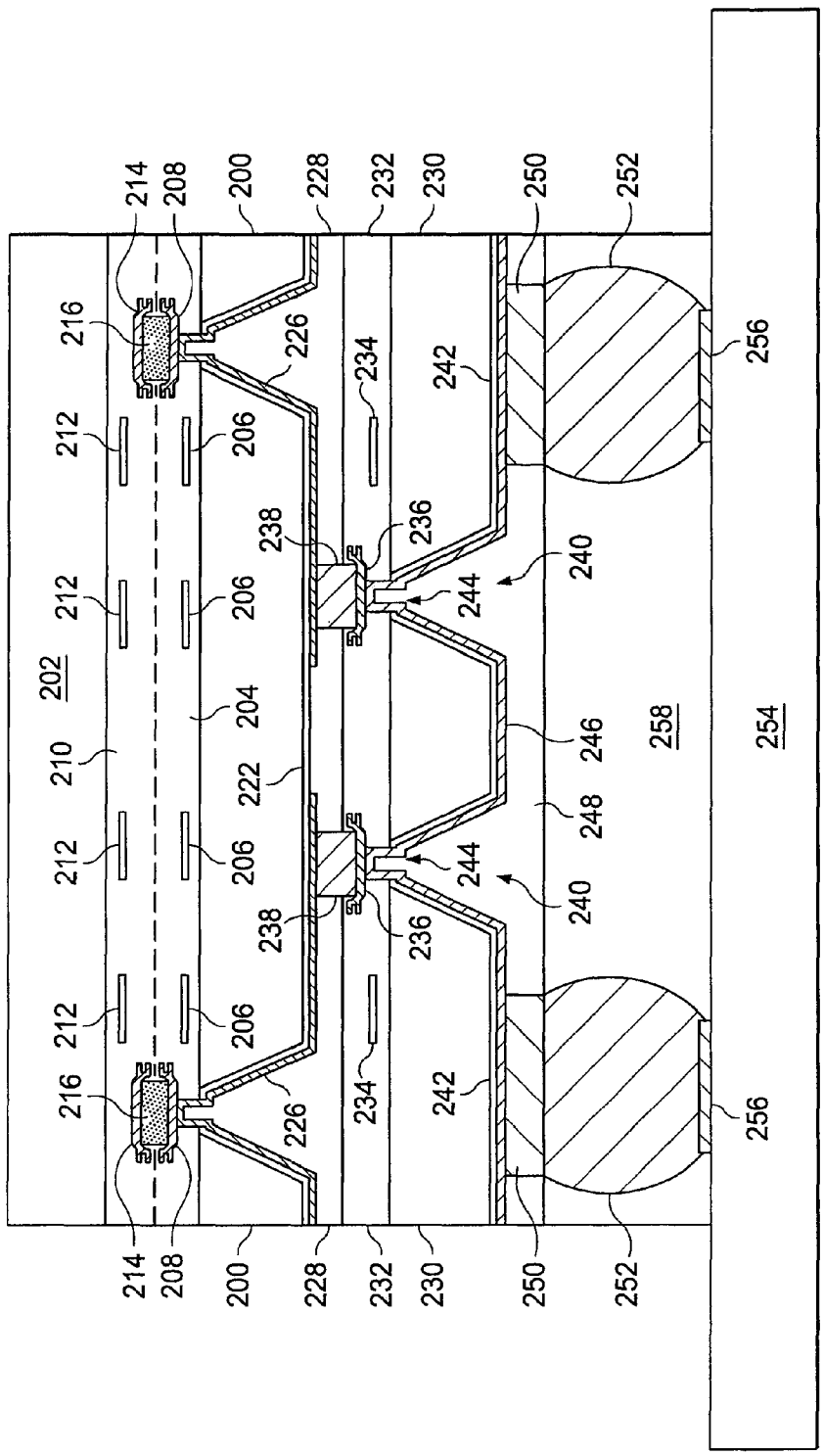

Turning to FIG. 4F, wafers 200, 202, and 230 are singulated and the package is mounted to substrate 254. Substrate 254 includes a PCB or other substrate for supporting and mounting electronic components. Bond pads 256 include a conductive material and are formed over substrate 254 using an electrolytic plating or electroless plating process. Bumps 252 are reflowed to connect bond pads 256 to UBM 250. An optional underfill 258 is deposited between wafer 230 and substrate 254. Underfill 258 includes a mold compound or other insulative material and provides physical support and electrical insulation to the package. Underfill 258 may further include a filler material to assist in matching the CTE of the package to underfill 258.

Using these methods a plurality of wafers can be physically bonded together and electrically interconnected to form a wafer-level package. After bonding, the semiconductor die are singulated and mounted over a PCB or other substrate. The process creates a 3-D wafer level package using a plurality of tapered vias that form electrical connections between the wafers. The vias connect metal contact or bond pads formed over one wafer with an RDL formed over the backside of another wafer. By forming wafer-level packages having direct and short electrical connections between two or more wafers, the present methods provide a package having a small footprint and a high-density input/output connection pad count.

Using the present methods, wafer-level packages can integrate wafers having similar functionality and contact or bond pad arrangements. For example, two similar wafers (such as two wafers containing semiconductor die providing memory functionality) or two dissimilar wafers (such as a wafer containing semiconductor die providing memory functionality and another with logic functionality) may be interconnected using the present methods. The wafers may be connected in a face-to-face or face-to-back configuration. In face-to-face wafer mount configurations, bond pads formed over a surface of each wafer are connected using a metal or conductive adhesive material. In face-to-back wafer mount configurations, bond pads formed over a surface of one wafer are interconnected with an RDL formed over a backside of the other wafer. After the wafers are connected, an external electrical interconnection structure is formed over one of the wafers to allow the package to be mounted to system components.

Accordingly, a plurality of wafers providing different chip applications can be stacked and interconnected at the wafer level. In one example, a wafer containing semiconductor die providing base band functionality can be combined with a wafer containing semiconductor die providing memory functionality. Because bond pad position on the different wafers vary, direct bond-pad to bond-pad connections cannot ordinarily be formed. Accordingly, the present methods allow for the connection of the bond pads formed over a surface of one wafer to be connected to the RDL formed over another.

Figure 5A:
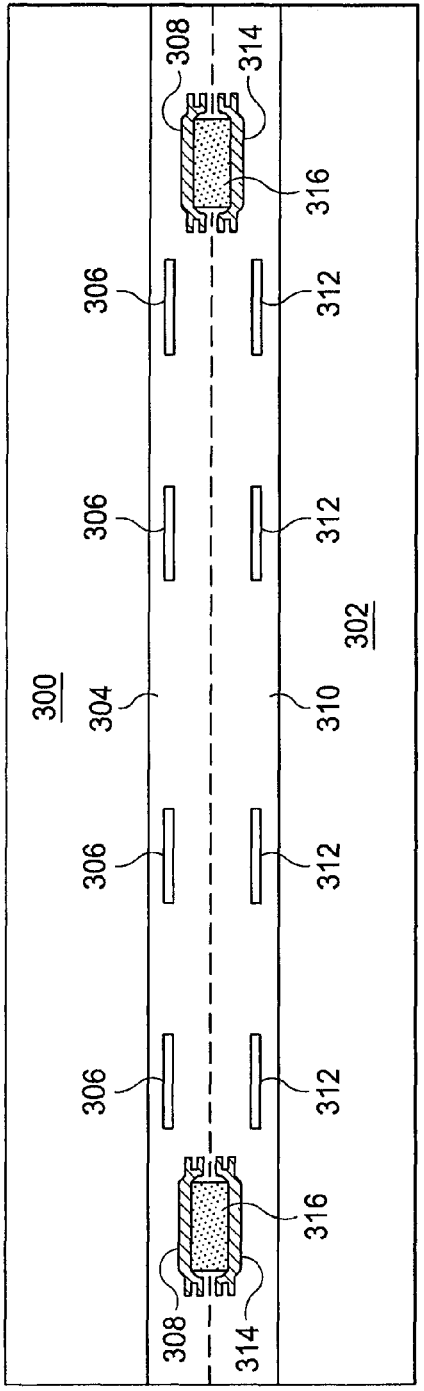
FIGS. 5A-5O illustrate a process for integrating three wafers into a semiconductor package and interconnecting the devices formed within each of the wafers.
Figure 5B:
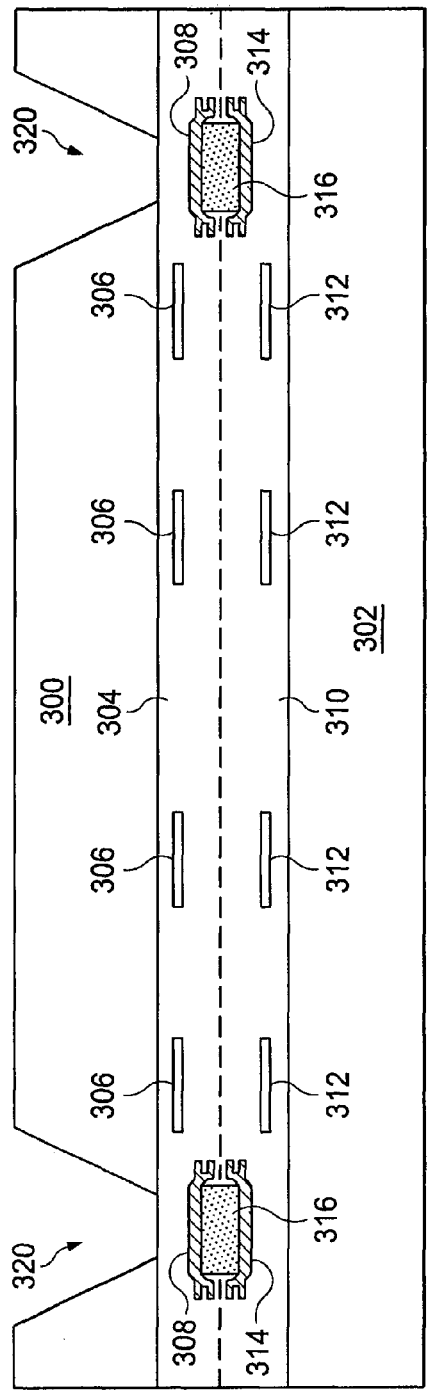
Figure 5E:
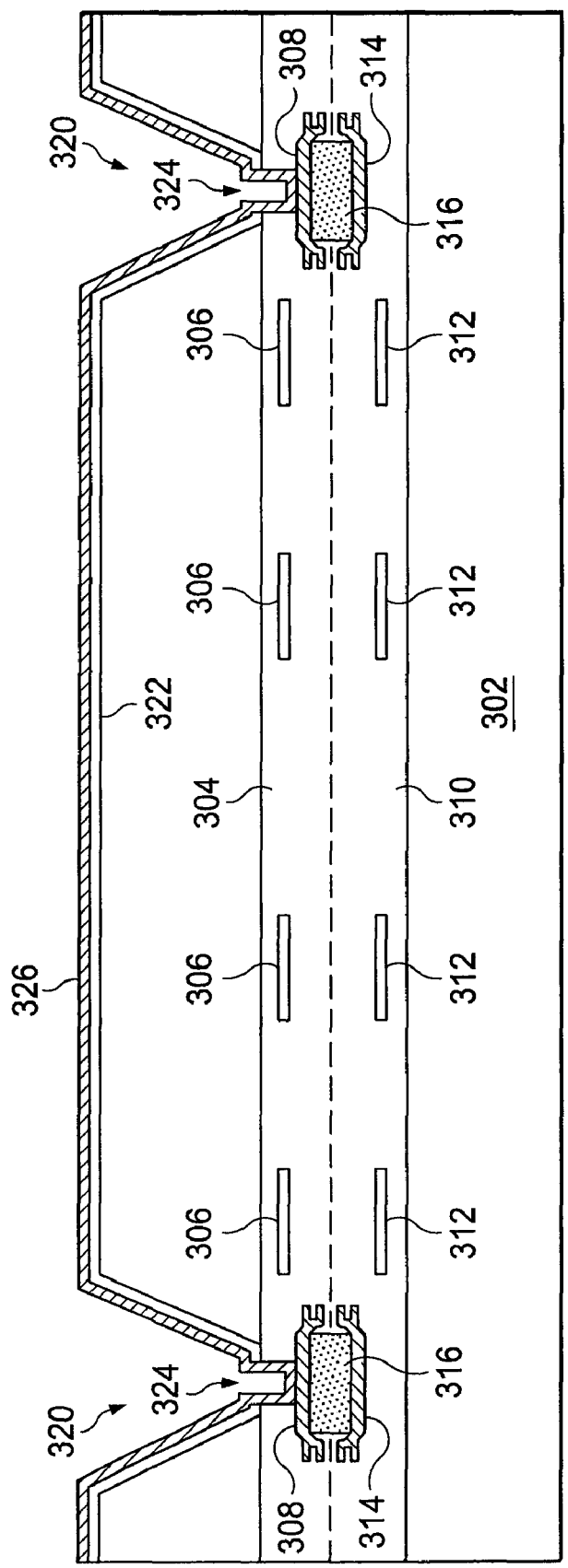
Figure 5F:
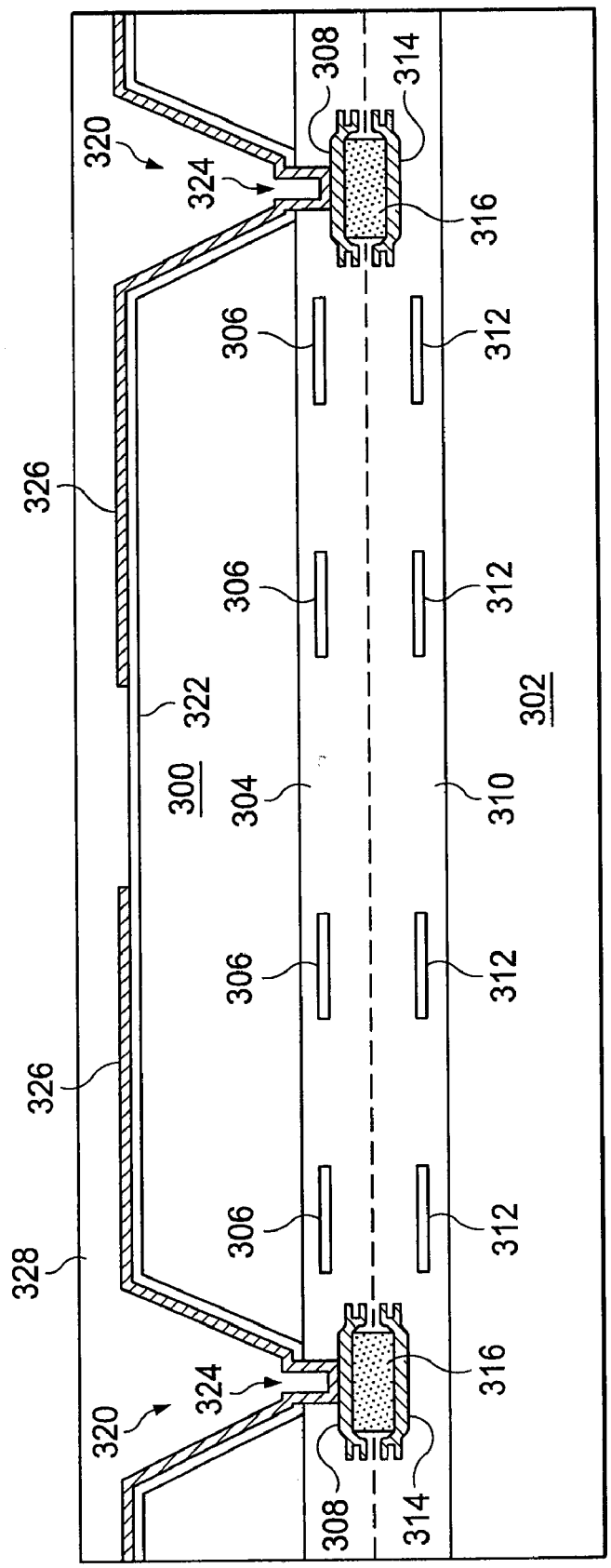
Figure 5G:
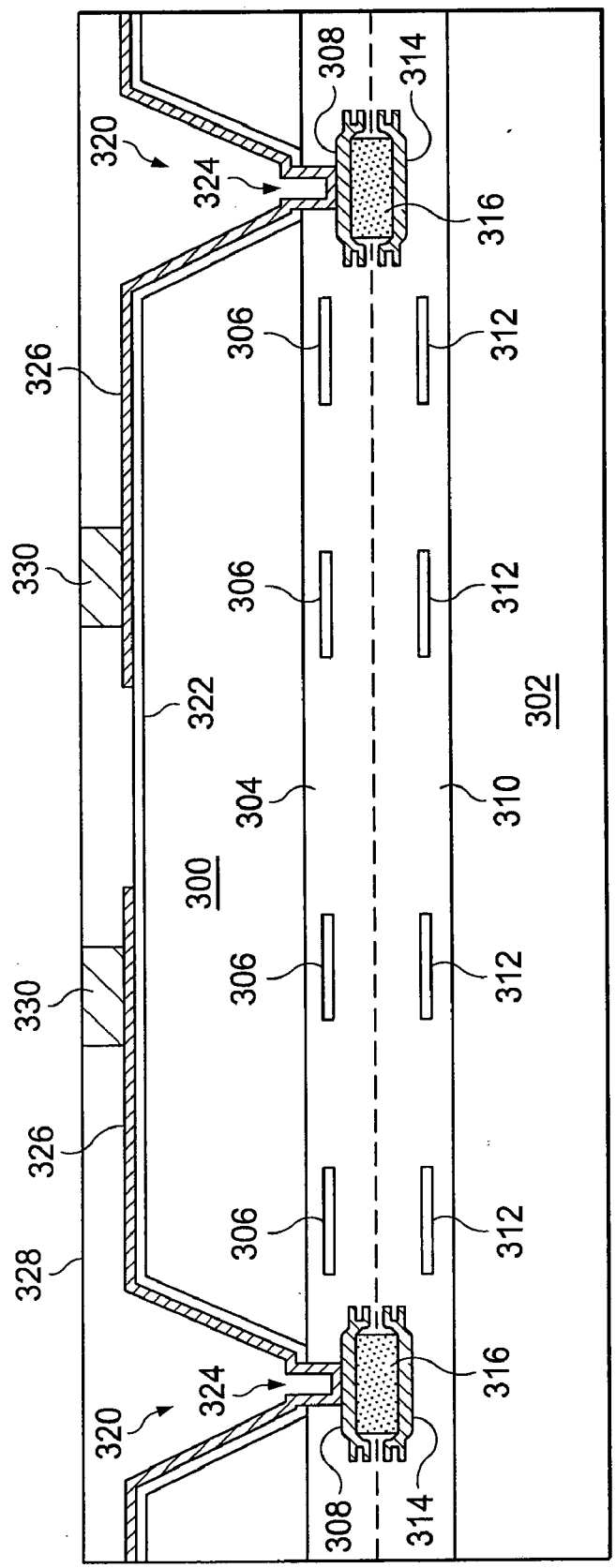
Figure 5H:
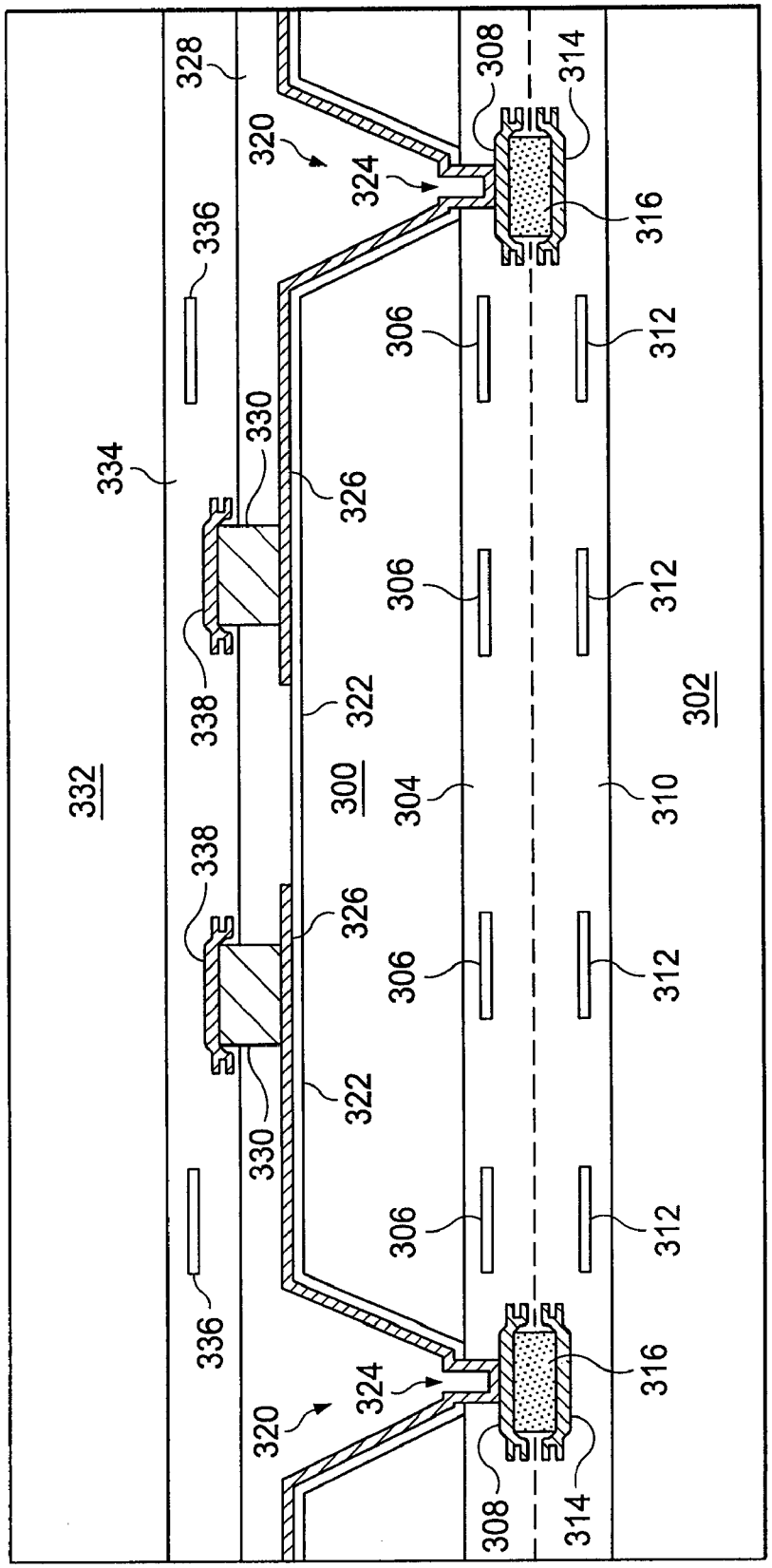
Figure 5I:
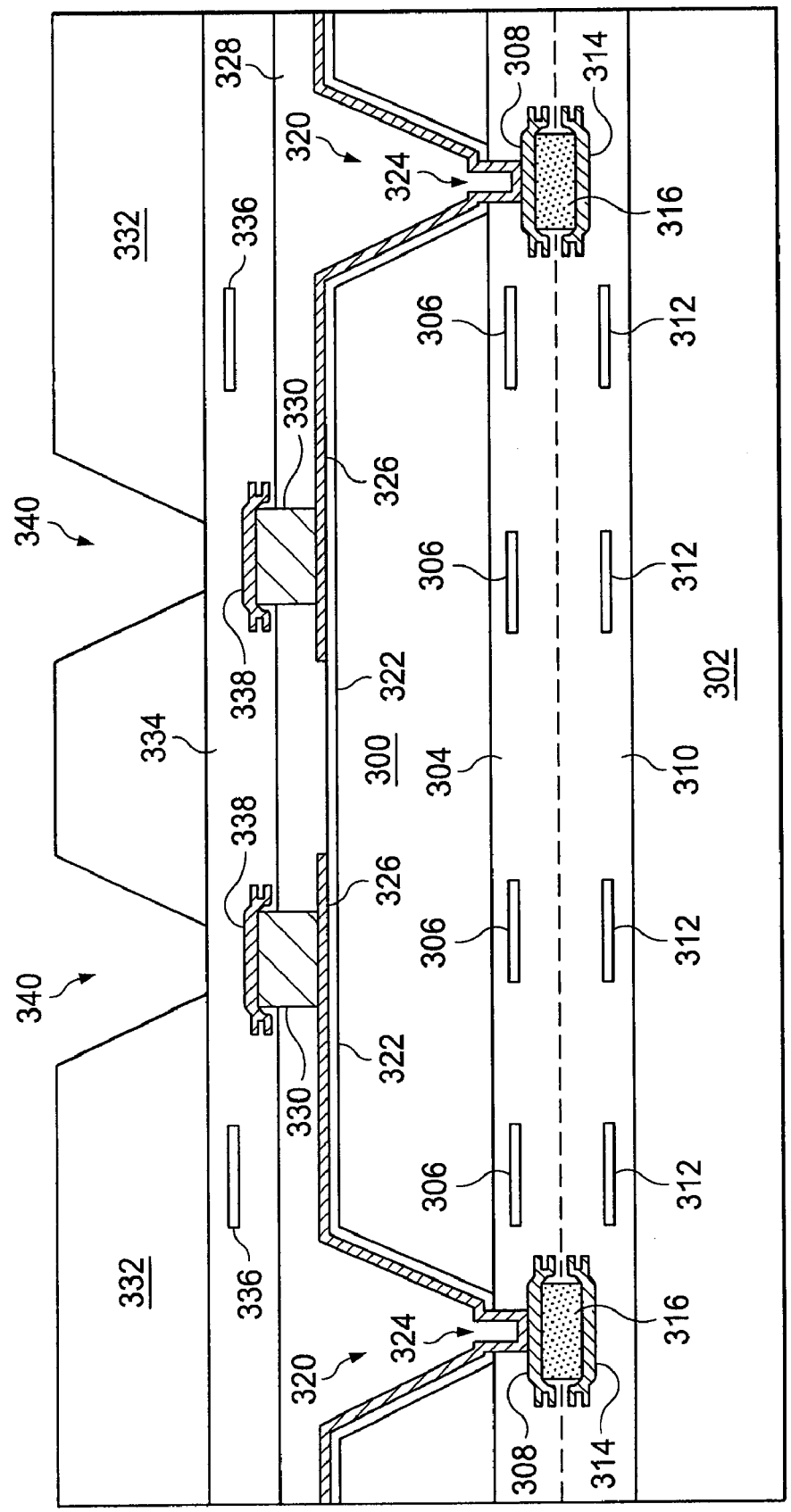
Figure 5J:
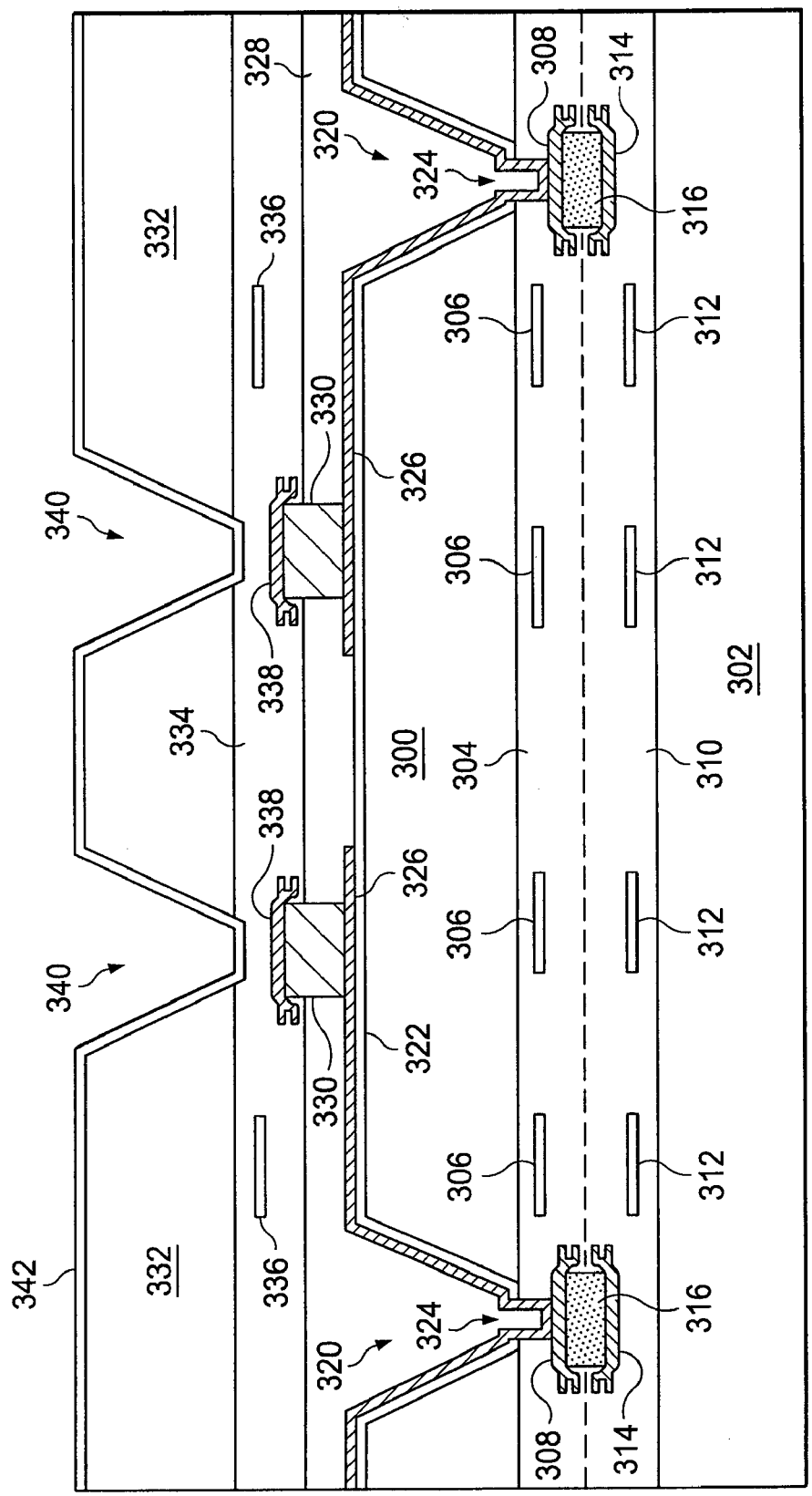
Figure 5K:
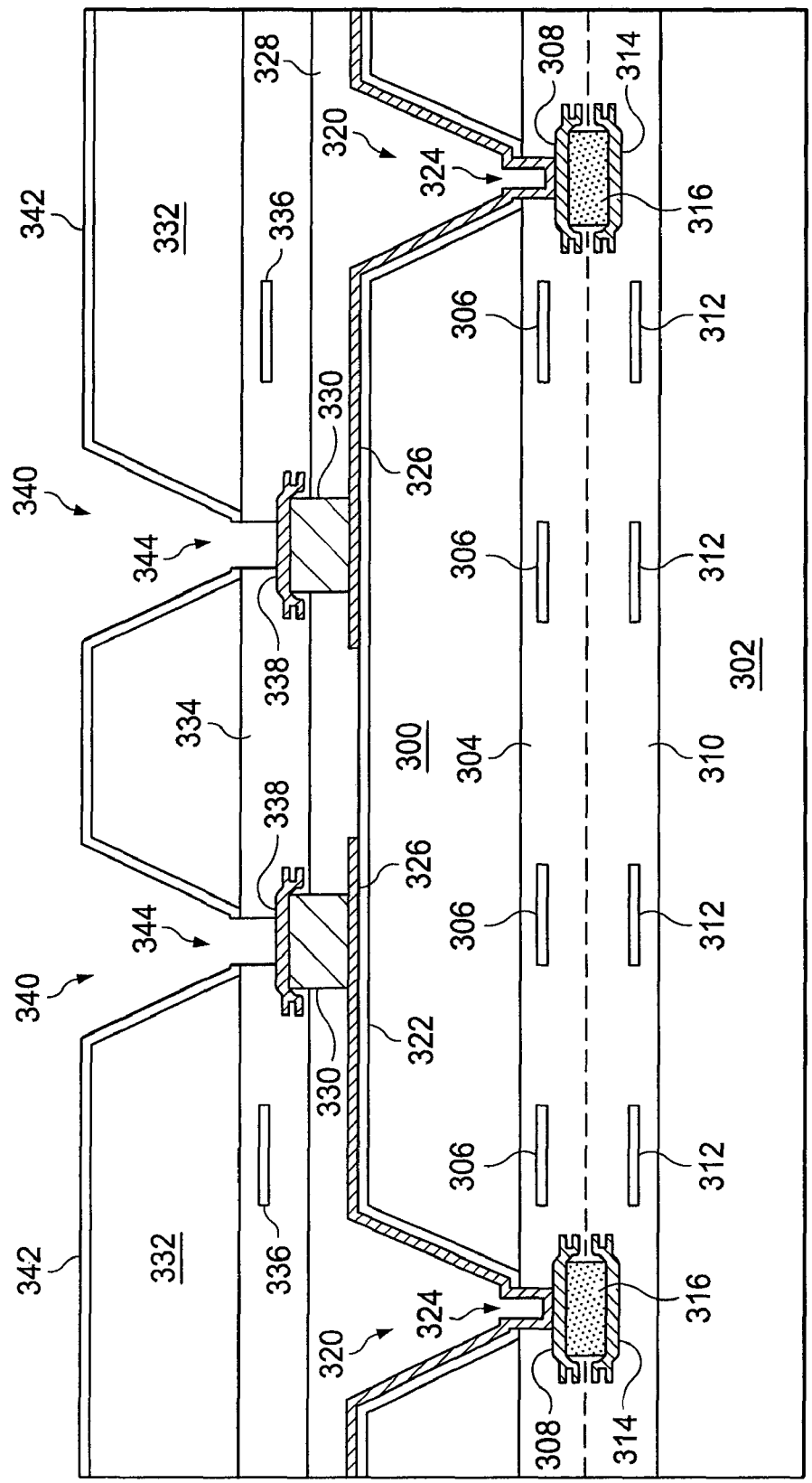
Figure 5L:
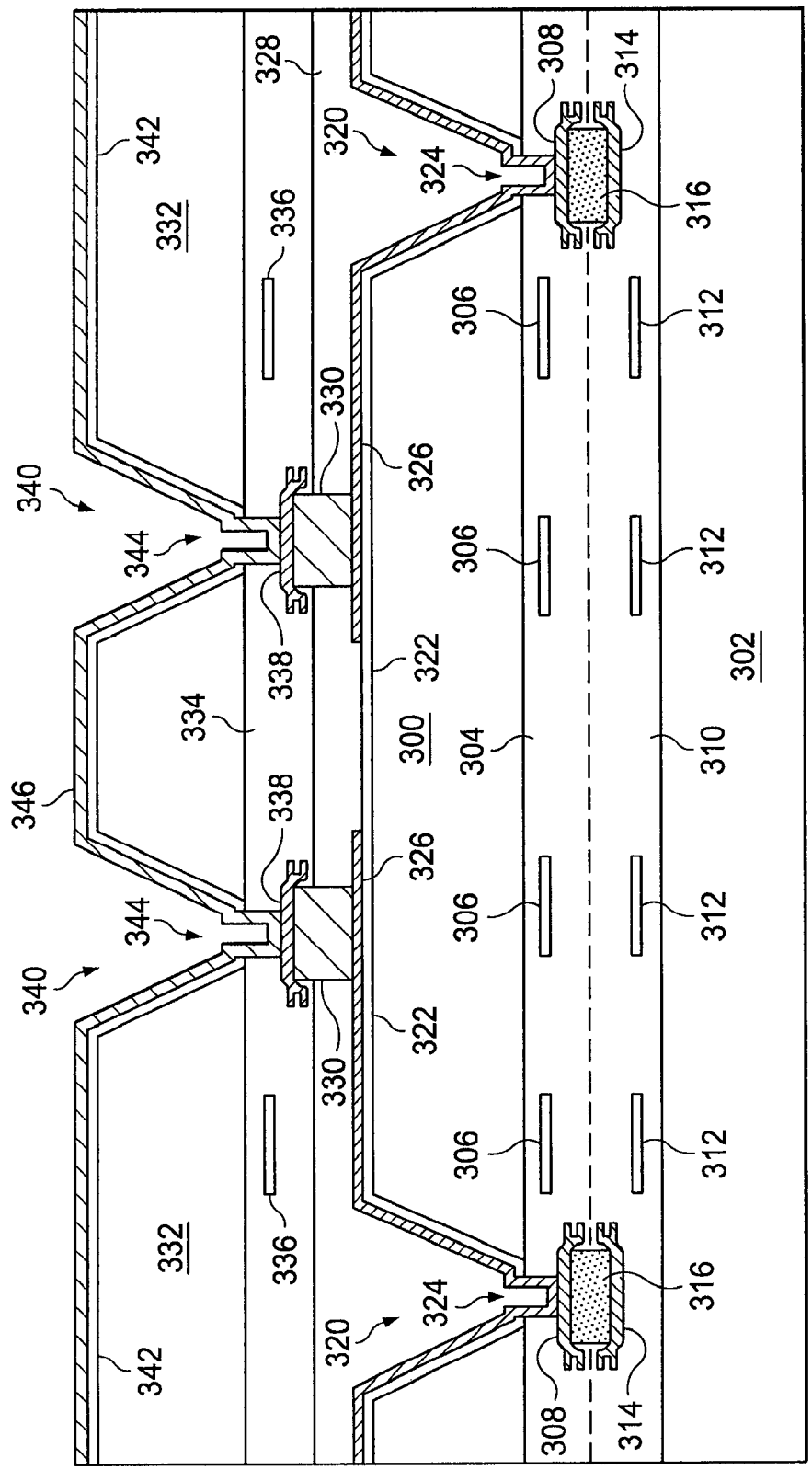
Figure 5M:
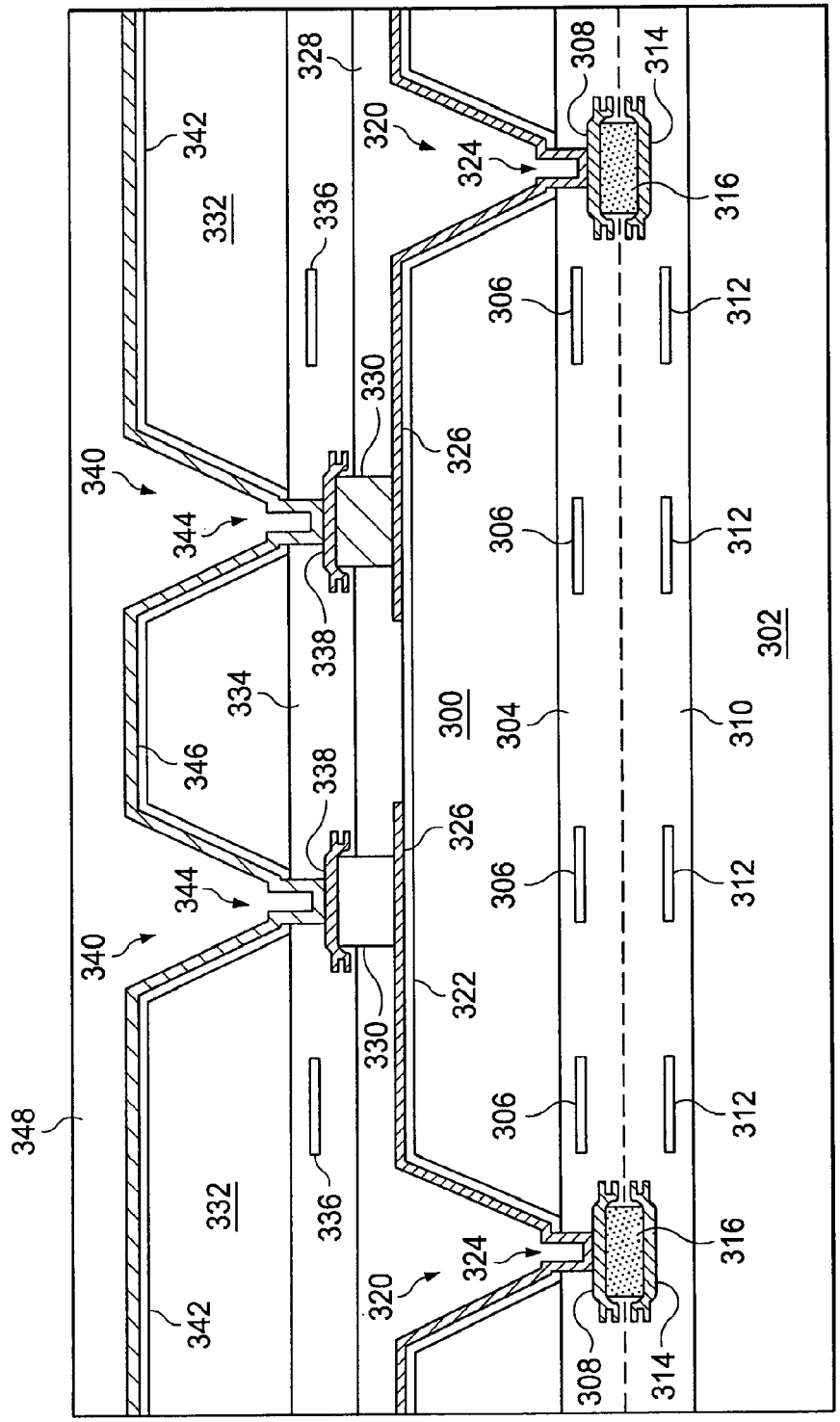
Figure 5N:
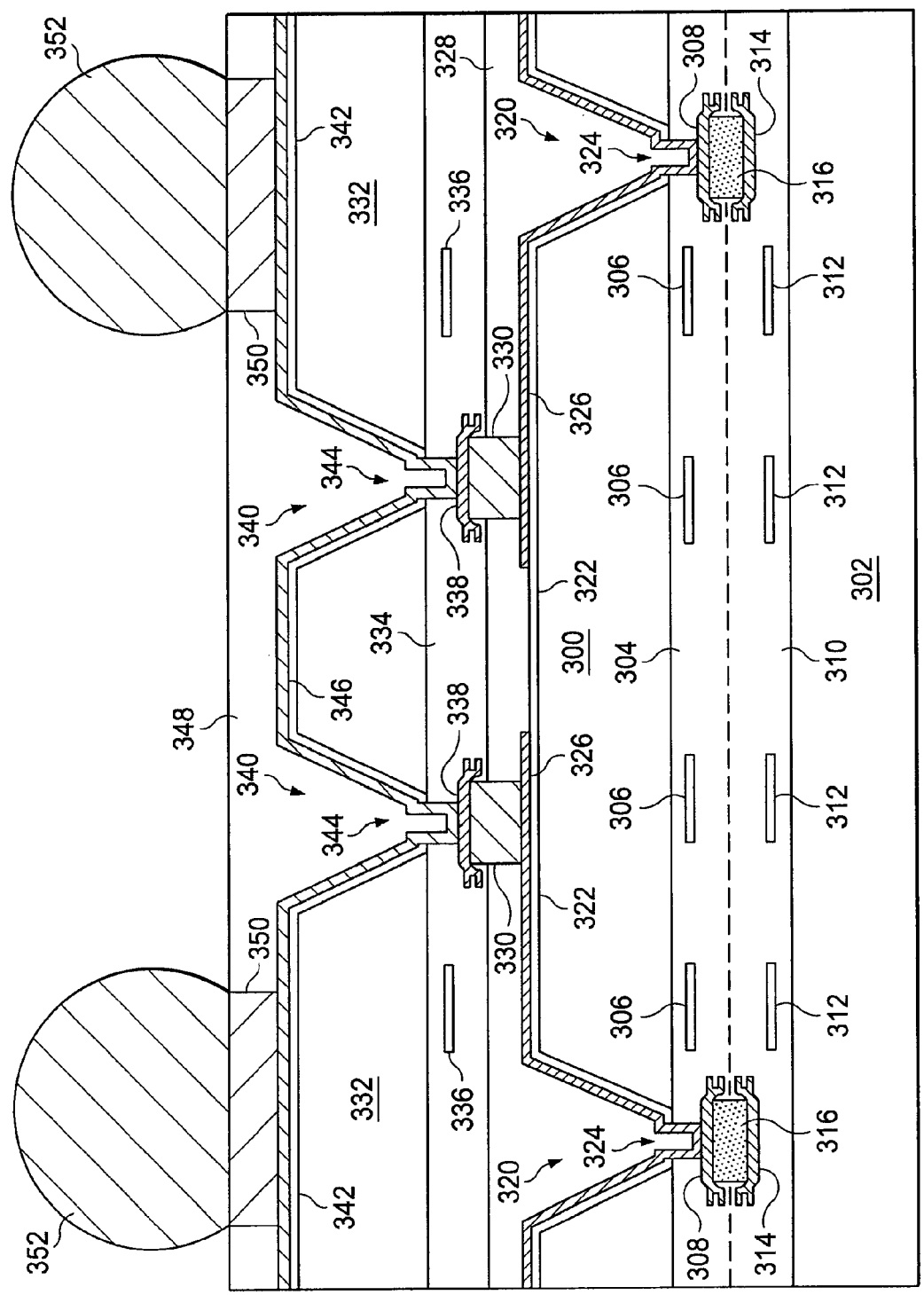
Figure 5O:
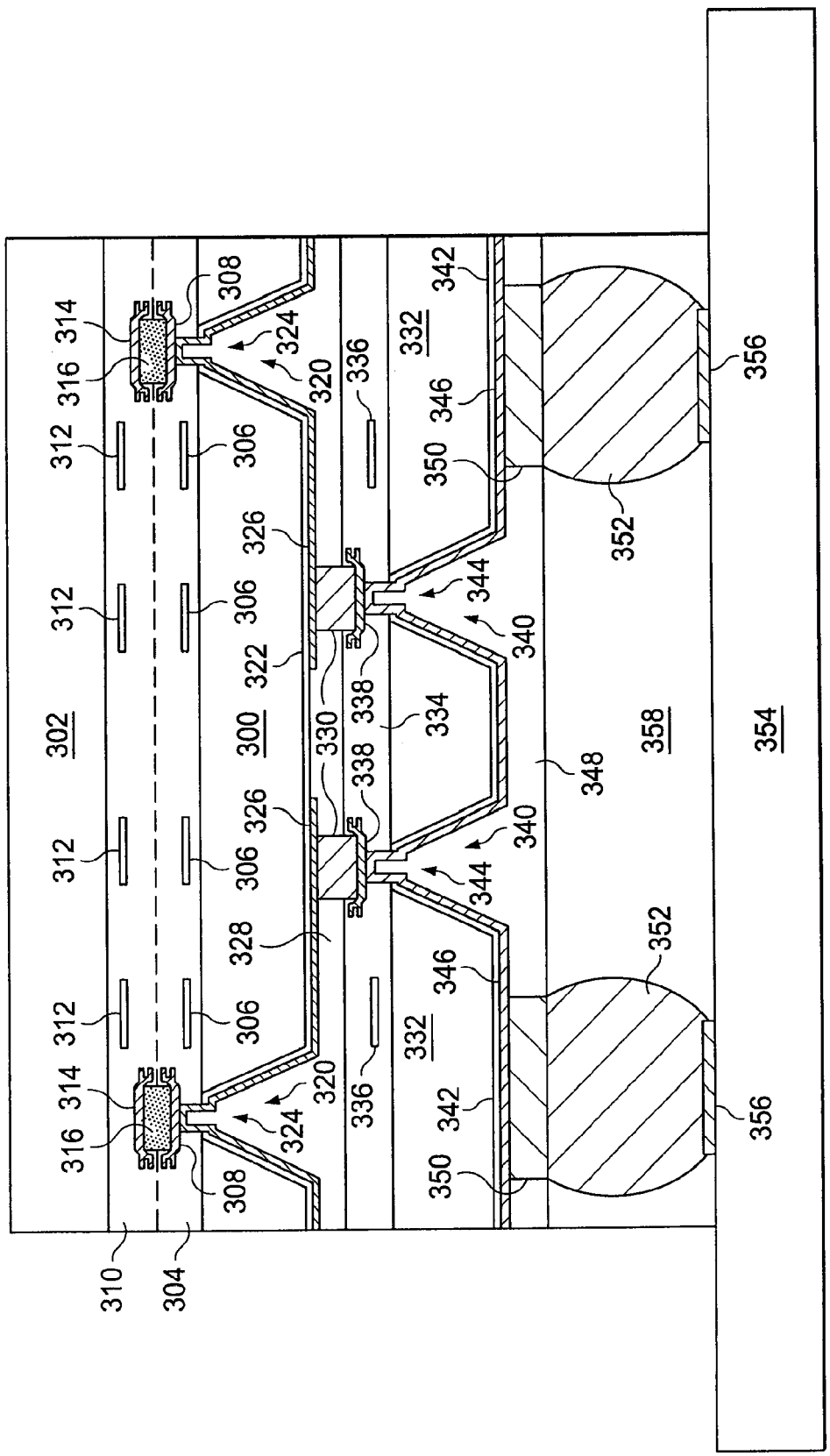

FIGS. 5A-5O illustrate a process for integrating three wafers into a semiconductor package and interconnecting the devices formed within each of the wafers. Turning to FIG. 5A, wafer 300 is inverted and the front surface of wafer 300 (including the active region of wafer 300) is bonded over the front surface of wafer 302. Wafers 300 and 302 can include Si, GaAs or other substrate materials over which thin-film devices or other circuitry are formed. Devices formed over wafers 300 and 302 include active and passive devices such as resistors, capacitors, transistors, and inductors. Depending upon the application, wafers 300 and 302 may include similar or differing configurations of semiconductor die, components and contact or bond pads formed over a surface of each wafer. Inter-level dielectric 304 is formed over a surface of wafer 300. Dielectric 304 acts as an insulator and provides physical protection to the devices formed over wafer 300. Dielectric 304 includes an oxide, nitride, or polymer dielectric material. Within dielectric 304, metal layer 306 is formed using an implantation or deposition process. Metal layer 306 electrically interconnects one or more of the devices formed within wafer 300. Bond pads 308 are formed over a surface of wafer 300. Bond pads 308 are electrically connected to one or more devices formed over wafer 300 and may be connected to metal layer 306. Inter-layer dielectric 310 and metal layer 312 are formed over a surface of wafer 302. Bond pads 314 include a conductive material and are formed over a surface of wafer 302 using a PVD, CVD, electrolytic plating, or electroless plating process. Bond pads 308 and 314 are bonded together using conductive adhesive or metal bonding 316. Additional adhesive material such as a thermal epoxy may be deposited between wafers 300 and 302 to enhance the physical bond between the structures. Both wafers 300 and 302 are thinned using a CMP, mechanical backgrinding, plasma etching, wet etch, dry etch or other thinning or planarization process.

Turning to FIG. 5B, TSVs 320 are formed in wafer 300 by etching or laser drilling. TSVs 320 expose a portion of dielectric 304. In the present embodiment, TSVs 320 have a tapered geometry, however TSVs having alternative geometries may be formed in wafers 300 or 302.

Turning to FIG. 5C, dielectric 322 is conformally deposited over wafer 300. Dielectric 322 acts as an insulator and includes one or more layers of an oxide, nitride, or polymer dielectric material. Other suitable dielectric materials include SiN, Ta2O5, HfO2, or a dielectric film material.

Turning to FIG. 5D, TSVs 320 are further etched to form vias 324. Vias 324 are formed by etching or laser drilling dielectric 322 and dielectric 304 to expose a portion of bond pads 308.

With reference to FIG. 5E, conductive or metal layer 326 is patterned and deposited over dielectric 322 and vias 324 in contact with bond pads 308. Metal layer 326 may be deposited conformally and comprises a portion of an RDL that operates as a conductive layer to route electrical signals to various areas of the package, including active and passive circuits of the various semiconductor die, and provides various electrical interconnect options during package integration. Metal layer 326 may include multiple layers of conductive material such as Ti, TiN, Cu, TiW, NiV, Al, Au, Ni, or other electrically conductive material suitable for deposition on a substrate.

Turning to FIG. 5F, passivation 328 is deposited over wafer 300 to provide electrical insulation and physical protection to the metal layers formed over the device. Passivation 328 includes an insulation material such as polyimide, BCB, PBO, epoxy based insulating polymer, or other insulating polymer materials. With reference to FIG. 5F, passivation 328 is deposited to fill TSVs 320. However, in other applications, passivation 328 is deposited to only partially fill vias 320, for example by providing a coating formed over a top surface of wafer 300.

Turning to FIG. 5G, passivation 328 is patterned to expose a portion of metal layer 326. Metal layer 330 is deposited into the etched portions of passivation 328 to form contact or bond pads for multi-wafer interconnection. Metal layer 330 includes a conductive material such as solder, conductive adhesive, or another conductive material. Metal layer 330 may be formed using a PVD, CVD, electrolytic plating, or electroless plating process.

With reference to FIG. 5H, a front surface of wafer 332 is mounted to the backside of wafer 300. Wafer 332 includes dielectric 334 disposed over the front surface of wafer 332. Within dielectric 334, metal layer 336 is formed using an implantation or deposition process. Metal layer 336 electrically interconnects one or more of the devices formed within wafer 332 and may be connected to bond pads 338. Bond pads 338 are formed over a surface of wafer 332. Bond pads 338 are electrically connected to one or more devices formed over wafer 332. Bond pads 338 are electrically and mechanically connected to metal layer 330 using a solder reflow, or other attachment process. Alternatively, metal layer 330 may include stud bumps or pillars and may be formed in a round or rectangular shape.

An optional adhesive material such as a thermal epoxy may be deposited between wafers 332 and 300 to enhance the physical bond between the wafers. Depending upon the application, wafer 332 may be thinned using a CMP or etching process to an appropriate thickness.

Turning to FIG. 5I, TSVs 340 are formed in the backside of wafer 332 by etching or laser drilling. TSVs 340 expose a portion of dielectric 334. In the present embodiment, TSVs 340 have a tapered geometry, however TSVs having alternative geometries may be formed in wafer 332.

Turning to FIG. 5J, dielectric 342 is conformally deposited over wafer 332. Dielectric 342 acts as an insulator and includes one or more layers of an oxide, nitride, or polymer dielectric material. Other suitable dielectric materials include SiN, Ta2O5, HfO2, or a dielectric film material.

With reference to FIG. 5K, TSVs 340 are further etched to form vias 344. Vias 344 are formed by etching or laser drilling dielectric 342 and dielectric 334 to expose a portion of bond pads 338.

Turning to FIG. 5L, conductive or metal layer 346 is patterned and deposited over dielectric 342 and vias 344 in contact with bond pads 338. Metal layer 346 may be deposited conformally and comprises a portion of an RDL and operates as a conductive layer to route electrical signals to various areas of the package, including active and passive circuits of the various semiconductor die, and provides various electrical interconnect options during package integration. Metal layer 346 may include multiple layers of conductive materials that are suitable for deposition on a substrate.

Turning to FIG. 5M, passivation 348 is deposited over wafer 332 to provide electrical insulation and physical support to the device. Passivation 348 includes an insulation material such as polyimide, BCB, PBO, epoxy based insulating polymer, or other insulating polymer materials. With reference to FIG. 5M, passivation 348 is deposited to fill TSVs 340. However, in other applications, passivation 348 is deposited to only partially fill vias 340, for example by coating a top surface of wafer 332.

With reference to FIG. 5N, an optional interconnect structure is formed over wafer 332. Passivation 348 is patterned or etched using a laser drilling, or etching process to expose a portion of metal layer 346. An optional UBM 350 is formed over the exposed portions of metal layer 346. Bumps 352 are formed and connected to UBM 350 by a reflow process applied to solder material deposited over UBM 350. Bumps 352 include Au, or Cu structures or another conductive material such as Sn/Pb, CuZn, or CuAg solder each containing an optional flux material. Alternative interconnection structures include stud bumps, or stud pillars having square, round, rectangular or other shapes. Alternatively, the metal pad or UBM may be used as a wire-bonding pad for wire bond interconnection.

Turning to FIG. 5O, wafers 300, 302, and 332 are singulated and the package is mounted to substrate 354. Substrate 354 includes a PCB or other substrate for supporting and mounting electronic components. Bond pads 356 include a conductive material and are formed over substrate 354 using an electrolytic plating or electroless plating process. Bumps 352 are reflowed to connect bond pads 356 to UBM 350. An optional underfill 358 is deposited between wafer 332 and substrate 354. Underfill 358 includes a mold compound or other insulative material and provides physical support and electrical insulation to the package. Underfill 358 may further include a filler material to assist in matching the CTE of the package to underfill 358.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first wafer having a bond pad formed over a front surface of the first wafer;
   providing a second wafer having a bond pad formed over a front surface of the second wafer;
   connecting the bond pads of the first and second wafers using a conductive adhesive;
   forming a first interconnect structure within the second wafer by,
   forming a first via in a back surface of the second wafer opposite the front surface, the first via exposing the bond pad of the second wafer, and
   forming a first metal layer conformally over the first via, the first metal layer being in electrical contact with the bond pad of the second wafer;
   mounting a third wafer over the second wafer by connecting a bond pad formed over a front surface of the third wafer to the first metal layer; and
   forming a second interconnect structure over a backside of the third wafer opposite the front surface, the second interconnect structure being electrically connected to the first metal layer.

2. The method of claim 1, including disposing adhesive material between the first and second wafers.

3. The method of claim 1, including forming a through silicon via (TSV) in a back surface of the second wafer, the TSV having a conical frustum shape.

4. The method of claim 1, including depositing passivation over the first metal layer.

5. The method of claim 4, wherein the passivation is deposited as a conformal coating.

6. The method of claim 1, wherein the second interconnect structure includes a plurality of solder bumps.

7. The method of claim 6, including connecting the second interconnect structure to a printed circuit board (PCB) by reflowing the solder bumps.

8. A method of making a semiconductor device, comprising:
   providing a first wafer having a bond pad formed over a front surface of the first wafer;
   providing a second wafer having a bond pad formed over a front surface of the second wafer;
   connecting the bond pads of the first and second wafers using a conductive adhesive;
   forming a first interconnect structure within the second wafer;
   mounting a third wafer over the second wafer by connecting a bond pad formed over a front surface of the third wafer to the first interconnect structure; and
   forming a second interconnect structure over a backside of the third wafer opposite the front surface, the second interconnect structure being electrically connected to the first interconnect structure.

9. The method of claim 8, wherein forming the first interconnect structure includes:
   forming a first via in a back surface of the second wafer opposite the front surface, the first via exposing the bond pad of the second wafer; and
   forming a first metal layer over the first via, the first metal layer being in electrical contact with the bond pad of the second wafer.

10. The method of claim 8, including disposing adhesive material between the first and second wafers.

11. The method of claim 8, including forming a through silicon via (TSV) in a back surface of the second wafer, the TSV having a conical frustum shape.

12. The method of claim 8, including depositing passivation over the first interconnect structure.

13. The method of claim 12, wherein the passivation is deposited as a conformal coating.

14. The method of claim 8, wherein the second interconnect structure includes a plurality of solder bumps.

15. The method of claim 14, including connecting the second interconnect structure to a printed circuit board (PCB) by reflowing the solder bumps.

16. A method of making a semiconductor device, comprising:
- providing a first wafer having a bond pad formed over a front surface of the first wafer;
- providing a second wafer having a bond pad formed over a front surface of the second wafer;
- connecting the bond pads of the first and second wafers using a conductive adhesive; and
- forming a first interconnect structure within the second wafer by,
  - forming a first via in a back surface of the second wafer opposite the front surface, the first via exposing the bond pad of the second wafer, and
  - forming a first metal layer over the first via, the first metal layer being in electrical contact with the bond pad of the second wafer.

17. The method of claim 16, including:
- mounting a third wafer over the second wafer by connecting a bond pad formed over a front surface of the third wafer to the first interconnect structure; and
- forming a second interconnect structure over a backside of the third wafer opposite the front surface, the second interconnect structure being electrically connected to the first interconnect structure.

18. The method of claim 16, including forming a through silicon via (TSV) in a back surface of the second wafer, the TSV having a conical frustum shape.

19. The method of claim 17, wherein the second interconnect structure includes a plurality of solder bumps.

20. The method of claim 19, including connecting the second interconnect structure to a printed circuit board (PCB) by reflowing the solder bumps.

21. A semiconductor device, comprising:
- a first wafer having a bond pad formed over a front surface of the first wafer;
- a second wafer having a bond pad formed over a front surface of the second wafer, the bond pad of the second wafer being connected to the bond pad of the first wafer using a conductive adhesive;
- a first interconnect structure formed within the second wafer, the first interconnect structure including,
  - a first via formed in a back surface of the second wafer opposite the front surface, the first via exposing the bond pad of the second wafer, and
  - a first metal layer formed conformally over the first via, the first metal layer being in electrical contact with the bond pad of the second wafer;
- a third wafer mounted over the second wafer by connecting a bond pad formed over a front surface of the third wafer to the first metal layer; and
- a second interconnect structure formed over a backside of the third wafer opposite the front surface, the second interconnect structure being electrically connected to the first metal layer.

22. The semiconductor device of claim 21, including a through silicon via (TSV) formed in a back surface of the second wafer, the TSV having a conical frustum shape.

23. The semiconductor device of claim 21, wherein the second interconnect structure includes a plurality of solder bumps.

24. The semiconductor device of claim 23, including a printed circuit board (PCB) connected to a plurality of solder bumps of the second interconnect structure.

25. The semiconductor device of claim 21, including a passivation layer deposited over the first metal layer, the passivation layer being deposited as a conformal coating.

* * * * *